United States Patent
Koshihara

(10) Patent No.: US 11,871,637 B2
(45) Date of Patent: Jan. 9, 2024

(54) DISPLAY DEVICE HAVING LENS CORRESPONDING TO PIXEL, AND ELECTRONIC APPARATUS

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/744,821

(22) Filed: May 16, 2022

(65) Prior Publication Data
US 2022/0293686 A1 Sep. 15, 2022

Related U.S. Application Data

(63) Continuation of application No. 16/869,639, filed on May 8, 2020, now Pat. No. 11,362,150.

(30) Foreign Application Priority Data

May 9, 2019 (JP) ................. 2019-088858

(51) Int. Cl.
| | | |
|---|---|---|
| *H10K 59/38* | (2023.01) | |
| *H10K 50/858* | (2023.01) | |
| *H10K 59/30* | (2023.01) | |
| *G06F 1/16* | (2006.01) | |
| *H10K 50/852* | (2023.01) | |
| *H10K 59/12* | (2023.01) | |

(52) U.S. Cl.
CPC .......... *H10K 59/38* (2023.02); *H10K 50/858* (2023.02); *H10K 59/30* (2023.02); *G06F 1/163* (2013.01); *H10K 50/852* (2023.02); *H10K 59/12* (2023.02)

(58) Field of Classification Search
CPC ..... H10K 59/38; H10K 50/858; H10K 59/121
See application file for complete search history.

(56) References Cited

U.S. PATENT DOCUMENTS

| | | | |
|---|---|---|---|
| 11,362,150 B2 * | 6/2022 | Koshihara | ............. H10K 59/30 |
| 2005/0231085 A1 | 10/2005 | Song et al. | |
| 2012/0217521 A1 | 8/2012 | Ohta | |
| 2013/0002130 A1 | 1/2013 | Sumida et al. | |

(Continued)

FOREIGN PATENT DOCUMENTS

| | | | |
|---|---|---|---|
| JP | H07-064014 A | 3/1995 | |
| JP | H10-228245 A | 8/1998 | |

(Continued)

*Primary Examiner* — Nduka E Ojeh
(74) *Attorney, Agent, or Firm* — Oliff PLC

(57) ABSTRACT

A display device according to the present disclosure includes a substrate, a lens layer including a lens, a pixel electrode disposed between the substrate and the lens layer, and a color filter disposed between the pixel electrode and the lens layer. The color filter includes a colored portion that overlaps a part of the pixel electrode in plan view and is disposed between the substrate and the lens layer. The pixel electrode is provided in a display region in which an image is displayed. The lens overlaps a part of the pixel electrode in the plan view. A distance between the center of the pixel electrode and the display center of the display region is shorter than a distance between the center of the lens and the display center in the plan view.

13 Claims, 14 Drawing Sheets

(56) References Cited

U.S. PATENT DOCUMENTS

| | | |
|---|---|---|
| 2013/0277659 A1 | 10/2013 | Sumida et al. |
| 2015/0276175 A1 | 10/2015 | Moriya et al. |
| 2016/0109752 A1 | 4/2016 | Tateno et al. |
| 2016/0282629 A1 | 9/2016 | Takagi et al. |
| 2017/0180685 A1 | 6/2017 | Takagi et al. |
| 2017/0184854 A1 | 6/2017 | Takagi et al. |
| 2017/0236876 A1 | 8/2017 | Akagawa et al. |
| 2018/0166488 A1* | 6/2018 | Sugizaki ................ H01L 27/14 |
| 2018/0288375 A1 | 10/2018 | Takagi et al. |
| 2019/0214420 A1* | 7/2019 | Kim ................ H01L 27/14605 |
| 2019/0221779 A1 | 7/2019 | Jang et al. |
| 2019/0251318 A1* | 8/2019 | Jung ................ H10K 50/844 |
| 2020/0358033 A1 | 11/2020 | Koshihara |
| 2021/0057678 A1 | 2/2021 | Motoyama et al. |

FOREIGN PATENT DOCUMENTS

| | | |
|---|---|---|
| JP | 2005-019148 A | 1/2005 |
| JP | 2005-310749 A | 11/2005 |
| JP | 2011-081916 A | 4/2011 |
| JP | 2012-190626 A | 10/2012 |
| JP | 2013-016272 A | 1/2013 |
| JP | 2013-251173 A | 12/2013 |
| JP | 2015-153607 A | 8/2015 |
| JP | 2015-216034 A | 12/2015 |
| JP | 2016-180934 A | 10/2016 |
| JP | 2016-224323 A | 12/2016 |
| JP | 2017-111363 A | 6/2017 |
| JP | 2019-012284 A | 1/2019 |
| WO | 2011/121668 A1 | 10/2011 |

* cited by examiner

DISPLAY DEVICE HAVING LENS CORRESPONDING TO PIXEL, AND ELECTRONIC APPARATUS

CROSS REFERENCE TO RELATED APPLICATION

This application is a continuation of U.S. application Ser. No. 16/869,639, filed May 8, 2020, the contents of which are incorporated herein by reference.

The present application is based on, and claims priority from JP Application Serial Number 2019-088858, filed May 9, 2019, the disclosure of which is hereby incorporated by reference herein in its entirety.

BACKGROUND

1. Technical Field

The present disclosure relates to a display device and an electronic apparatus.

2. Related Art

Display devices such as organic EL display devices that use an organic electroluminescence (EL) element have been known. JP-A-2015-153607 discloses an organic EL device that includes an organic EL element including a pixel electrode, and a color filter that transmits light in a predetermined wavelength range.

For a display device including a color filter as in JP-A-2015-153607, there is a desire to improve a visual field angle characteristic or to increase a radiation angle.

SUMMARY

An aspect of a display device according to the present disclosure includes a substrate, a lens layer including a lens, a pixel electrode disposed between the substrate and the lens layer, and a color filter disposed between the pixel electrode and the lens layer, where the color filter includes a colored portion that overlaps a part of the pixel electrode in plan view between the substrate and the lens layer, the pixel electrode is provided in a display region in which an image is displayed, the lens overlaps a part of the pixel electrode in the plan view, and a distance between the center of the pixel electrode and a display center of the display region is shorter than a distance between the center of the lens and the display center in the plan view.

DESCRIPTION OF EXEMPLARY EMBODIMENTS

Figure 1:
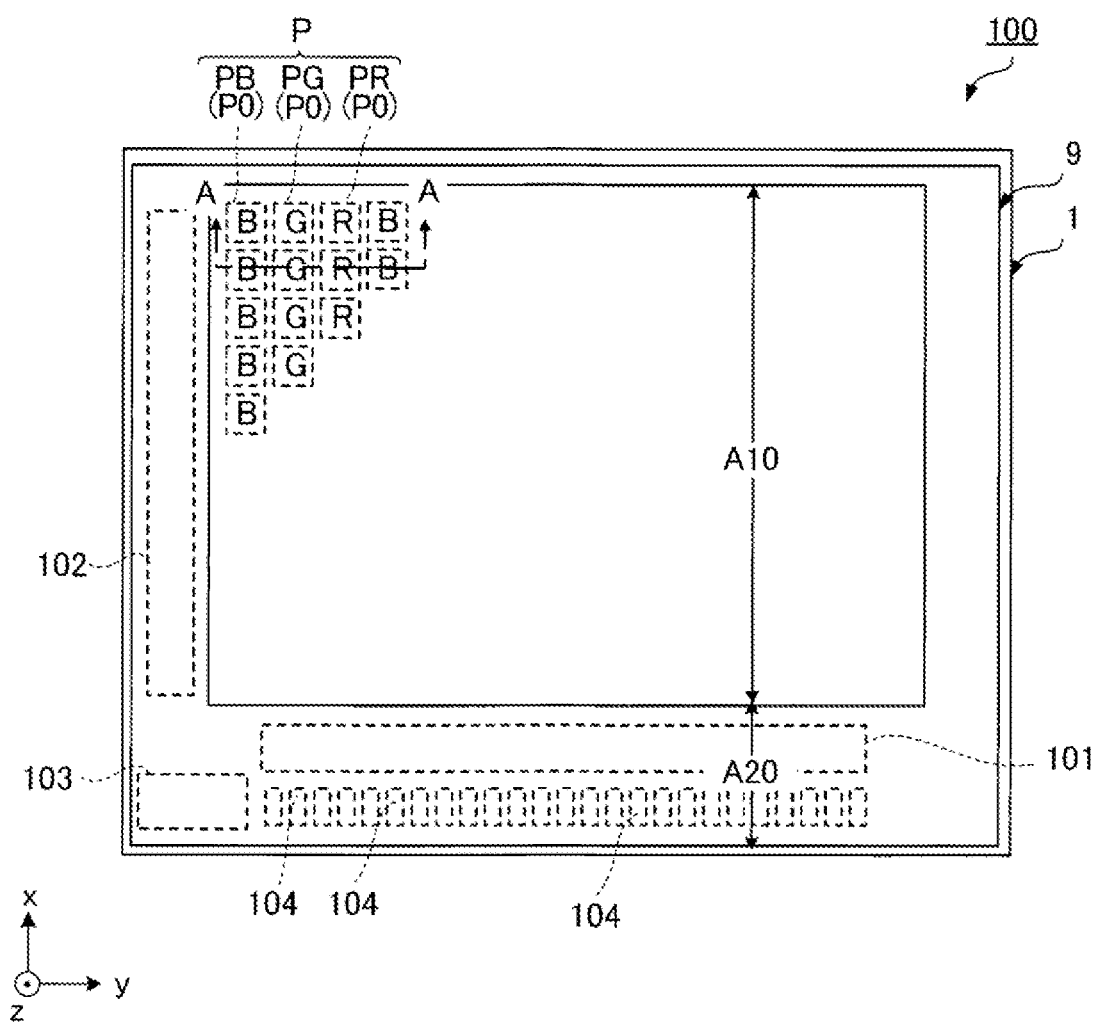
FIG. 1 is a plan view illustrating a display device according to a first exemplary embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions.

1. First Exemplary Embodiment

1A. Display Device 100

FIG. 1 is a plan view illustrating a display device 100 according to a first exemplary embodiment. Note that, for convenience of explanation, the description will be made appropriately using an x-axis, a y-axis, and a z-axis orthogonal to each other illustrated in FIG. 1. An element substrate 1 of the display device 100 described later is parallel to an x-y plane. Further, the "plan view" refers to viewing from a −z direction. A direction in which a transmissive substrate 9 described later and the element substrate 1 overlap each other is a direction parallel to the −z direction. A thickness direction of the element substrate 1 described later is a direction parallel to the −z direction. Further, in the following description, "translucency" refers to transparency to visible light, and means that a transmittance of visible light may be equal to or greater than 50%.

The display device 100 is an organic electroluminescence (EL) display device that displays a full color image. The image includes an image that displays only character information. The display device 100 includes the element substrate 1 and the transmissive substrate 9 that is located on the +z-axis side of the element substrate 1 and has translucency. The display device 100 has a so-called top-emitting structure. The display device 100 emits light from the transmissive substrate 9. The transmissive substrate 9 is a cover that protects the element substrate 1.

The element substrate 1 includes a display region A10 in which an image is displayed, and a peripheral region A20 that surrounds the display region A10 in plan view. Note that a planar shape of the display region A10 is a quadrangular shape, but the shape is not limited thereto, and may be another polygonal shape. Further, a planar shape of the display region A10 may not be completely quadrangular, and may have rounded corners or may be partially missing. Further, the element substrate 1 includes a plurality of pixels P, a data line drive circuit 101, a scanning line drive circuit 102, a control circuit 103, and a plurality of external terminals 104.

The display region A10 is constituted of the plurality of pixels P. Each of the pixels P is the smallest unit in display of an image. The pixels P are arranged in matrix along the +x direction and the +y direction. Each of the pixels P includes a sub-pixel PB from which light in a blue wavelength region is acquired, a sub-pixel PG from which light in a green wavelength region is acquired, and a sub-pixel PR from which light in a red wavelength region is acquired. A shape of the sub-pixels PB, PG, and PR in each plan view is substantially quadrangular. The sub-pixels PB, the sub-pixels PG, and the sub-pixels PR are arranged in the same color along the +x direction, and are arranged repeatedly in the order of blue, green, and red along the +y direction. Note that, when the sub-pixel PB, the sub-pixel PG, and the sub-pixel PR are not differentiated, they are expressed as a sub-pixel P0. The sub-pixel P0 is an element that constitutes the pixel P. The sub-pixel P0 is an example of a unit circuit that is the smallest unit of an image to be displayed, and one pixel of a color image is expressed by the sub-pixel PB, the sub-pixel PG, and the sub-pixel PR. The sub-pixel P0 is controlled independently of the other sub-pixel P0.

The data line drive circuit 101, the scanning line drive circuit 102, the control circuit 103, and the plurality of external terminals 104 are disposed in the peripheral region A20 of the element substrate 1. The data line drive circuit 101 and the scanning line drive circuit 102 are peripheral circuits that control driving of each portion constituting the plurality of sub-pixels P0. The control circuit 103 controls display of an image. Image data and the like are supplied from a higher circuit (not illustrated) to the control circuit 103. The control circuit 103 supplies various signals based on the image data to the data line drive circuit 101 and the scanning line drive circuit 102. A flexible printed circuit (FPC) substrate and the like for achieving electrical coupling to the higher circuit (not illustrated) are coupled to the external terminals 104. Further, a power supply circuit (not illustrated) is electrically coupled to the element substrate 1.

Figure 2:
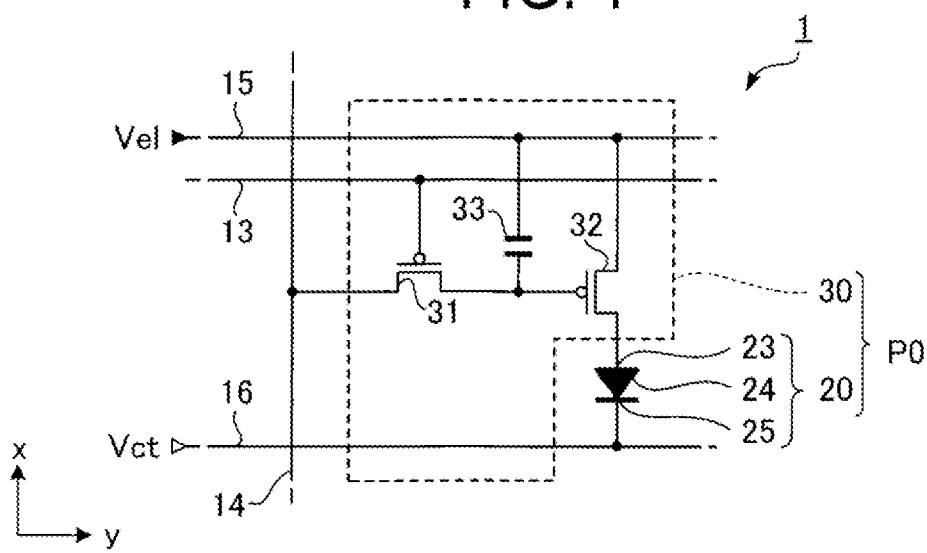
FIG. 2 is an equivalent circuit diagram of a sub-pixel according to the first exemplary embodiment.

FIG. 2 is an equivalent circuit diagram of the sub-pixel P0 according to the first exemplary embodiment. As illustrated in FIG. 2, a scanning line 13 and a data line 14 are provided on the element substrate 1. The scanning line 13 extends along the +y direction. The data line 14 extends along the +x direction. Note that there are a plurality of the scanning lines 13 and the data lines 14. The plurality of scanning lines 13 and the plurality of data lines 14 are arranged in a lattice shape. The plurality of scanning lines 13 are coupled to the scanning line drive circuit 102 illustrated in FIG. 1. The plurality of data lines 14 are coupled to the data line drive circuit 101 illustrated in FIG. 1. The sub-pixel P0 is provided to correspond to each of intersections between the plurality of scanning lines 13 and the plurality of data lines 14. Herein, a pixel electrode 23 is provided in each of the sub-pixels P0. The pixel electrode 23 can be set to be independent of and different from the other pixel electrode 23. More specifically, the pixel electrodes 23 may be set to flow different currents, or different voltages may be set to the pixel electrodes 23.

Each of the sub-pixel P0 includes an organic EL element 20 and a pixel circuit 30 that controls driving of the organic EL element 20. The organic EL element 20 includes the pixel electrode 23, a common electrode 25, and a functional layer 24 disposed between the pixel electrode 23 and the common electrode 25. The pixel electrode 23 functions as an anode. The common electrode 25 functions as a cathode. In the organic EL element 20, positive holes supplied from the pixel electrode 23 and electrons supplied from the common electrode 25 are recombined in the functional layer 24, and thus the functional layer 24 emits light. Note that a power supplying line 16 is electrically coupled to the common electrode 25. A power supply potential Vct on a low potential side is supplied from the power supply circuit (not illustrated) to the power supplying line 16.

The pixel circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and the other is electrically coupled to a gate of the driving transistor 32. Further, one of a source and a drain of the driving transistor 32 is electrically coupled to a power supplying line 15, and the other is electrically coupled to the pixel electrode 23. Note that a power supply potential Vel on a high potential side is supplied from the power supply circuit (not illustrated) to the power supplying line 15. Further, one of electrodes of the retention capacitor 33 is coupled to the gate of the driving transistor 32, and the other electrode is coupled to the power supplying line 15.

When the scanning line 13 is selected by activating a scanning signal by the scanning line drive circuit 102, the switching transistor 31 provided in the selected sub-pixel P0 is turned on. Then, the data signal is supplied from the data line 14 to the driving transistor 32 corresponding to the selected scanning line 13. The driving transistor 32 supplies a current corresponding to a potential of the supplied data signal, that is, a current corresponding to a potential difference between the gate and the source, to the organic EL element 20. Then, the organic EL element 20 emits light at luminance corresponding to a magnitude of the current supplied from the driving transistor 32. Further, when the scanning line drive circuit 102 releases the selection of the scanning line 13 and the switching transistor 31 is turned off, the potential of the gate of the driving transistor 32 is held by the retention capacitor 33. Thus, the organic EL element 20 can emit light even after the switching transistor 31 is turned off.

Note that the configuration of the pixel circuit 30 described above is not limited to the illustrated configuration. For example, the pixel circuit 30 may further include a transistor that controls the conduction between the pixel electrode 23 and the driving transistor 32.

Figure 3:
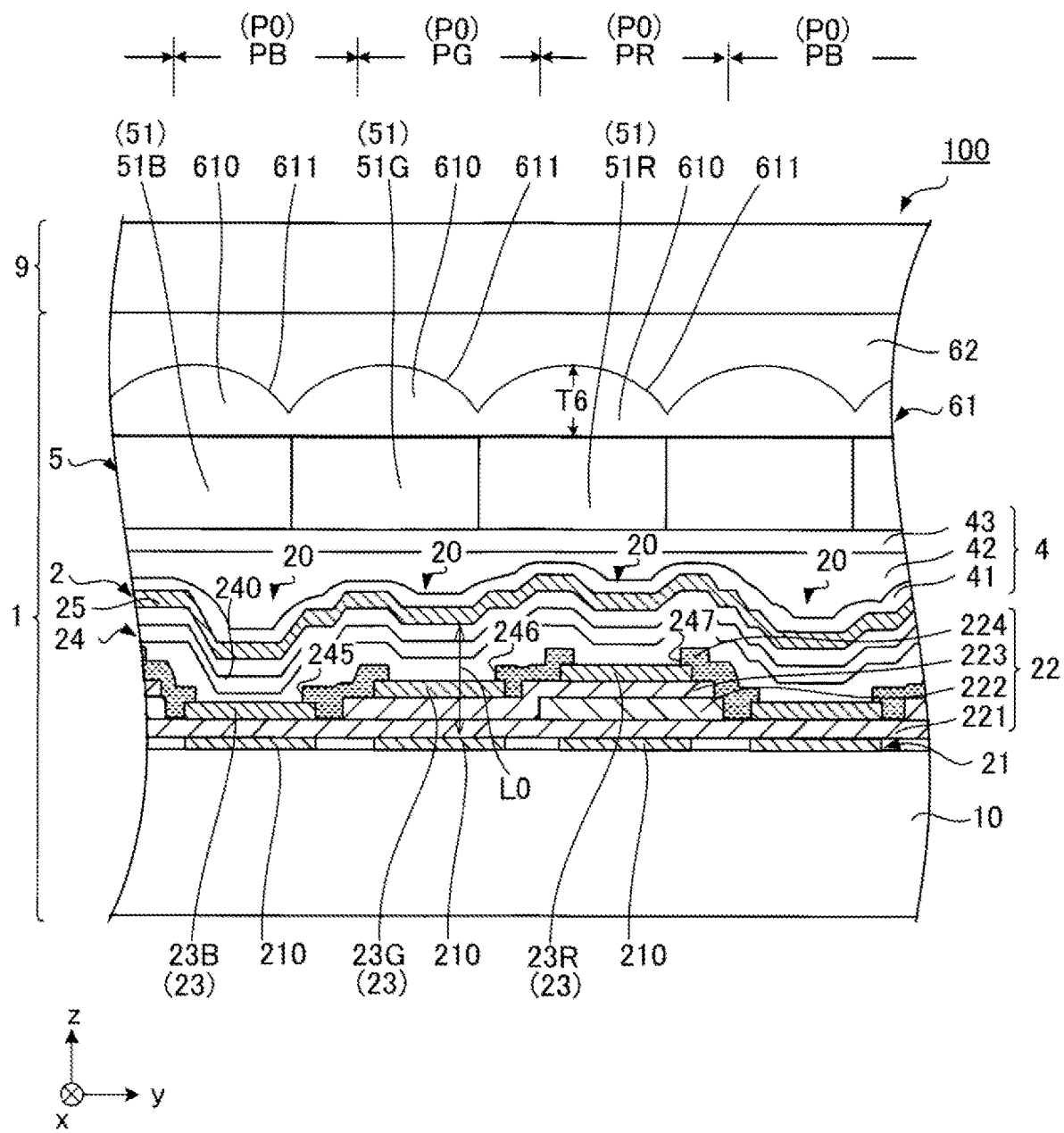
FIG. 3 is a diagram illustrating a partial cross section of the display device according to the first exemplary embodiment.

FIG. 3 is a diagram illustrating a partial cross section of the display device 100 according to the first exemplary embodiment, and is a diagram corresponding to a cross section of the display device 100 taken along an A-A line in FIG. 1. A partial cross section near an outer edge of the display region A10 is illustrated in FIG. 3.

As illustrated in FIG. 3, the element substrate 1 includes a substrate 10, a reflection layer 21, an insulating layer 22, an element portion 2, a protective layer 4, a color filter 5, a lens layer 61, and a light-transmitting layer 62. The reflection layer 21 includes a plurality of reflection portions 210. The element portion 2 includes the plurality of pixel electrodes 23, the functional layer 24, and the common electrode 25. In other words, the element portion 2 includes the plurality of organic EL elements 20 described above. The color filter 5 includes a plurality of colored portions 51. The lens layer 61 includes a plurality of lenses 610. Further, the reflection layer 21, the insulating layer 22, the element portion 2, the protective layer 4, the color filter 5, the lens layer 61, and the light-transmitting layer 62 are arranged in this order from the substrate 10 toward the transmissive substrate 9.

One sub-pixel P0 is provided with one reflection portion 210, one pixel electrode 23, one colored portion 51, and one lens 610. Note that, in the following, the pixel electrode 23 provided in the sub-pixel PB is referred to as a "pixel electrode 23B", the pixel electrode 23 provided in the sub-pixel PG is referred to as a "pixel electrode 23G", and the pixel electrode 23 provided in the sub-pixel PR is referred to as a "pixel electrode 23R". Note that, when these pixel electrodes 23B, 23G, and 23R are not differentiated, they are expressed as the pixel electrode 23. Similarly, the colored portion 51 provided in the sub-pixel PB is referred to as a "colored portion 51B", the colored portion 51 provided in the sub-pixel PG is referred to as a "colored portion 51G", and the colored portion 51 provided in the sub-pixel PR is referred to as a "colored portion 51R". Note that, when these colored portions 51B, 51G, and 51R are not differentiated, they are expressed as the colored portion 51. Each of the portions of the display device 100 will be sequentially described below.

The substrate 10 is a wiring substrate on which the pixel circuit 30 described above is formed on a base material formed of, for example, a silicon substrate. Note that the base material may be made of glass, resin, ceramic, or the like. In the present exemplary embodiment, the display device 100 is a top-emission type, and thus the base material may or may not have translucency. Further, the switching transistor 31 and the driving transistor 32 of the pixel circuit 30 may each be a MOS type transistor including an active layer, and the active layer may be formed of a silicon substrate, for example. The switching transistor 31 and the driving transistor 32 of the pixel circuit 30 may be thin film transistors or may be field effect transistors. Examples of a constituent material for each portion constituting the pixel circuit 30 and various wires include conductive materials such as polysilicon, metal, metal silicide, and a metallic compound.

The reflection layer 21 having light reflecting properties is provided on the substrate 10. The plurality of reflection portions 210 of the reflection layer 21 are disposed in matrix in plan view, for example. One reflection portion 210 is disposed so as to correspond to one pixel electrode 23. In other words, the reflection portion 210 and the pixel electrode 23 are disposed in a one-to-one manner. Further, each of the reflection portions 210 overlaps the pixel electrode 23 in plan view. Each of the reflection portions 210 reflects light generated in a light-emitting layer 240 of the functional layer 24. Therefore, each of the reflection portions 210 has light reflecting properties.

Examples of a constituent material for the reflection layer 21 include metals such as aluminum (Al) and silver (Ag), or alloys of these metals. Note that the reflection layer 21 may function as wiring that is electrically coupled to the pixel circuit 30.

The insulating layer 22 having insulating properties is disposed on the reflection layer 21. The insulating layer 22 includes a first insulating film 221, a second insulating film 222, a third insulating film 223, and a fourth insulating film 224. The first insulating film 221 is disposed so as to cover the reflection layer 21. The first insulating film 221 is formed in common across the sub-pixels PB, PG, and PR. The first insulating film 221 overlaps the pixel electrodes 23B, 23G, and 23R in plan view. The second insulating film 222 is disposed on the first insulating film 221. The second insulating film 222 overlaps the pixel electrode 23R in plan view and does not overlap the pixel electrodes 23B and 23G in plan view. The third insulating film 223 is disposed so as to cover the second insulating film 222. The third insulating film 223 overlaps the pixel electrodes 23R and 23G in plan view, and does not overlap the pixel electrode 23B in plan view. The fourth insulating film 224 covers an outer edge of each of the pixel electrodes 23B, 23G, and 23R.

The insulating layer 22 adjusts an optical distance L0 being an optical distance between the reflection portion 210 and the common electrode 25 described later. The optical distance L0 varies for each light emission color. The optical distance L0 in the sub-pixel PB is set so as to correspond to the light in the blue wavelength region. The optical distance L0 in the sub-pixel PG is set so as to correspond to the light in the green wavelength region. The optical distance L0 in the sub-pixel PR is set so as to correspond to the light in the red wavelength region. In the present exemplary embodiment, a thickness of the insulating layer 22 varies depending on the sub-pixels PB, PG, and PR, and thus the optical distance L0 varies for each light emission color.

Examples of a constituent material for each of the layers constituting the insulating layer 22 include silicon-based inorganic materials such as silicon oxide and silicon nitride. Note that the configuration of the insulating layer 22 is not limited to the configuration illustrated in FIG. 3. In FIG. 3, the third insulating film 223 is disposed on the second insulating film 222, but the second insulating film 222 may be disposed on the third insulating film 223, for example.

The plurality of pixel electrodes 23 are disposed on the insulating layer 22. The plurality of pixel electrodes 23 are disposed between the substrate 10 and the lens layer 61 described later. Further, the pixel electrode 23 has translucency. Examples of a constituent material for the pixel electrode 23 include transparent conductive materials such as Indium Tin Oxide (ITO) and Indium Zinc Oxide (IZO). The plurality of pixel electrodes 23 are electrically insulated from each other by the insulating layer 22. The pixel electrode 23B is disposed on a surface on the +z-axis side of the first insulating film 221. The pixel electrode 23G is disposed on a surface on the +z-axis side of the second insulating film 222. The pixel electrode 23R is disposed on a surface on the +z-axis side of the third insulating film 223.

Figure 4:
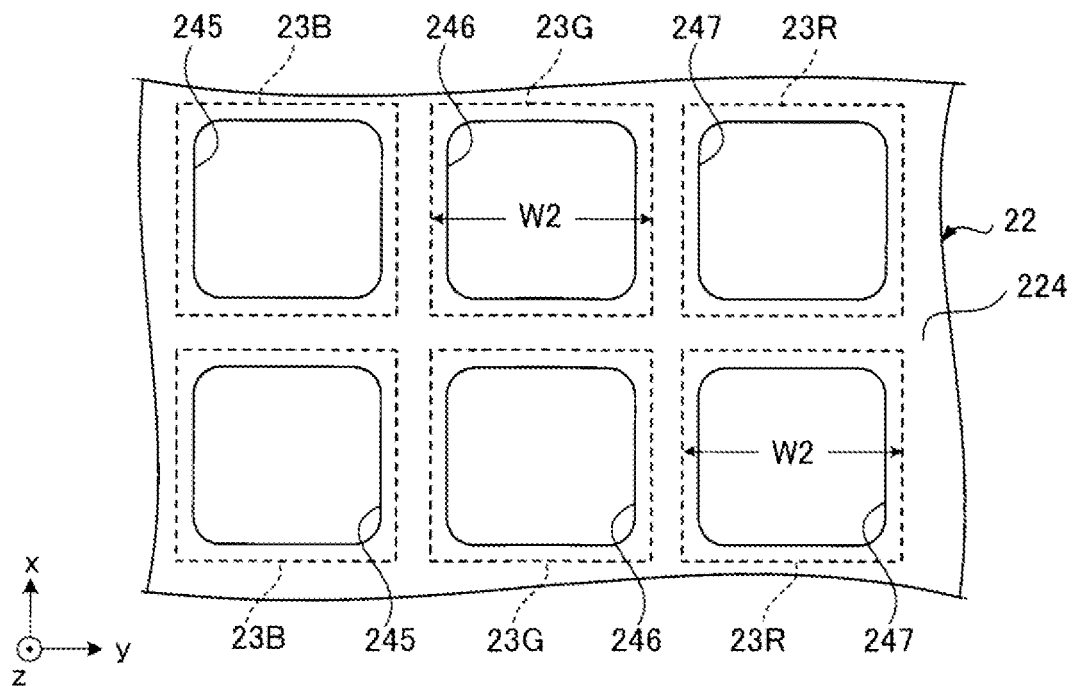
FIG. 4 is a plan view illustrating a pixel electrode according to the first exemplary embodiment.

FIG. 4 is a plan view illustrating the pixel electrodes 23B, 23G, and 23R according to the first exemplary embodiment. A shape of the pixel electrodes 23B, 23G, and 23R in each plan view is not particularly limited, but the shape is substantially quadrangular in the example illustrated in FIG. 4. The fourth insulating film 224 includes an opening 245 overlapping the pixel electrode 23B in plan view, an opening 246 overlapping the pixel electrode 23G in plan view, and an opening 247 overlapping the pixel electrode 23R in plan view. Each of the openings 245, 246, and 247 is a hole formed in the fourth insulating film 224.

As illustrated in FIG. 3, a portion excluding the outer edge of each of the pixel electrodes 23B, 23G, and 23R is exposed and is in contact with the functional layer 24. Thus, a portion overlapping the opening 245 in plan view illustrated in FIG. 4 substantially functions as the pixel electrode 23B. Similarly, a portion overlapping the opening 246 in plan view substantially functions as the pixel electrode 23G. A portion overlapping the opening 247 in plan view substantially functions as the pixel electrode 23R. The portions overlapping the opening 245, the opening 246, and the opening 247 are light-emitting portions that contribute to light emission. A portion of the element portion 2 overlapping the light-emitting portion in plan view is a light-emitting region in which light is emitted.

In the present exemplary embodiment, planar areas of the plurality of pixel electrodes 23 are equal to each other. They may be different from each other. Further, widths W2 of the plurality of pixel electrodes 23 are equal to each other, but may be different from each other. Note that the width W2 is a length along the +y direction.

The functional layer 24 is disposed in common to the sub-pixels PB, PG, and PR. The functional layer 24 includes the light-emitting layer 240 that contains an organic light-emitting material. The organic light-emitting material is a light-emitting organic compound. In addition to the light-emitting layer 240, the functional layer 24 includes, for example, a positive hole injecting layer, a positive hole transport layer, an electron transport layer, an electron injecting layer, and the like. The functional layer 24 includes the light-emitting layer 240 from which the light emission colors of blue, green, and red are acquired, and achieves white light emission. Note that the configuration of the functional layer 24 is not particularly limited to the configuration described above, and a known configuration can be applied.

The common electrode 25 is disposed on the functional layer 24. In other words, the common electrode 25 is disposed between the plurality of pixel electrodes 23 and the lens layer 61 described later. The common electrode 25 is disposed in common to the sub-pixels PB, PG, and PR. The common electrode 25 has light reflecting properties and translucency. Examples of a constituent material for the common electrode 25 include various metals such as alloys including Ag such as MgAg.

The common electrode 25 resonates light generated in the light-emitting layer 240 between the reflection layer 21 and the common electrode 25. A light resonance structure in which light with a desired resonant wavelength can be extracted for each of the sub-pixels PB, PG, and PR is formed by providing the common electrode 25 and the reflection layer 21. The light resonance structure is formed, and thus light emission at enhanced luminance is acquired at a resonance wavelength corresponding to each light emission color. The resonant wavelength is determined by the optical distance L0 described above. When a peak wavelength of a spectrum of light in a predetermined wavelength region is represented by λ0, the following relationship [1] holds true. Φ(radian) represents a sum of phase shifts that occur during transmission and reflection between the reflection portion 210 and the common electrode 25.

$$\{(2 \times L0)/\lambda 0 + \Phi)\}/(2\pi) = m0 (m0 \text{ is an integer}) \quad [1]$$

The optical distance L0 is set such that a peak wavelength of light in a wavelength region to be extracted is λ0. The light in the predetermined wavelength region is enhanced by adjusting the optical distance L0 in accordance with the light in the wavelength region to be extracted, and the light can be increased in intensity and a spectrum of the light can be narrowed.

Note that, in the present exemplary embodiment, as described above, the optical distance L0 is adjusted by varying the thickness of the insulating layer 22 for each of the sub-pixels PB, PG, and PR. However, the optical distance L0 may be adjusted by varying the thickness of the pixel electrode 23 for each of the sub-pixels PB, PG, and PR, for example. Further, the thickness of the insulating layer 22 is set in consideration of a refractive index of a constituent material for each of the layers constituting the insulating layer 22.

The protective layer 4 having translucency is formed on the common electrode 25. The protective layer 4 protects the organic EL element 20 and the like. The protective layer 4 may protect each of the organic EL elements 20 from external moisture, oxygen, or the like. In other words, the protective layer 4 has gas barrier properties. Thus, reliability of the display device 100 can be increased as compared to a case in which the protective layer 4 is not provided. The protective layer 4 includes a first layer 41, a second layer 42, and a third layer 43. The first layer 41, the second layer 42, and the third layer 43 are laminated in this order in the +z direction from the common electrode 25.

Examples of a constituent material for the first layer 41 and the third layer 43 include silicon-based inorganic materials including nitrogen such as silicon oxynitride and silicon nitride. When the first layer 41 is mainly composed of a silicon-based inorganic material including nitride, the gas barrier properties of the first layer 41 can be increased further than those when the first layer 41 is mainly composed of silicon oxide. The same also applies to the third layer 43.

Examples of a constituent material for the second layer 42 include resin materials such as epoxy resins. The unevenness of a surface of the first layer 41 described above on the +z-axis side is influenced by the unevenness of a surface on the +z-axis side of the common electrode 25. Thus, by providing the second layer 42 formed of a resin material, the unevenness of the surface on the +z-axis side of the first layer 41 can be suitably relieved. Thus, the surface on the +z-axis side of the protective layer 4 can be made flat. Further, a constituent material for the second layer 42 may be an inorganic material such as silicon oxide, such as silicon dioxide, and aluminum oxide, for example. Even when a defect such as a pinhole occurs in the first layer 41 during manufacturing, the defect can be complemented by providing the second layer 42 formed of the inorganic material. Thus, it is possible to particularly effectively suppress transmission of moisture and the like in the atmosphere to the functional layer 24 with, as a path, a defect such as a pinhole that may occur in the first layer 41.

Note that other materials except for the constituent materials described above may be included in the first layer 41, the second layer 42, and the third layer 43 to the extent that the function of each layer is not reduced. The protective layer 4 is not limited to the configuration including the first layer 41, the second layer 42, and the third layer 43, and may further include a layer other than these layers. Further, any two or more of the first layer 41, the second layer 42, and the third layer 43 may be omitted.

The color filter 5 is disposed on the protective layer 4. The color filter 5 is disposed between the pixel electrode 23 and the lens layer 61. The color filter 5 selectively transmits the light in the predetermined wavelength region. Color purity of light emitted from the display device 100 can be increased by providing the color filter 5 as compared to a case in which the color filter 5 is not provided. The color filter 5 is formed of a resin material such as an acrylic photosensitive resin material containing a color material, for example. The predetermined wavelength region that selectively transmits light includes the peak wavelength λ0 determined by the optical distance L0.

The color filter 5 includes the colored portion 51B that transmits the light in the blue wavelength region, the colored portion 51G that transmits the light in the green wavelength region, and the colored portion 51R that transmits the light in the red wavelength region. Further, the colored portion 51B blocks the light in the green wavelength region and the light in the red wavelength region, the colored portion 51G blocks the light in the blue wavelength region and the light in the red wavelength region, and the colored portion 51R blocks the light in the blue wavelength region and the light in the green wavelength region.

Figure 5:
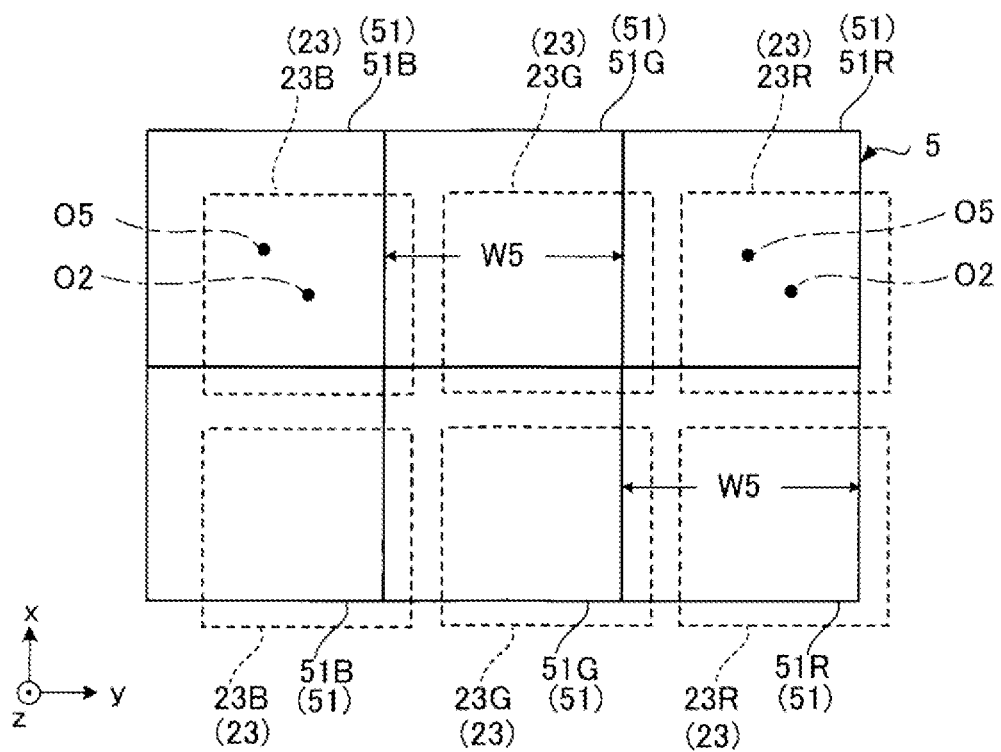
FIG. 5 is a plan view illustrating a part of a color filter according to the first exemplary embodiment.

FIG. 5 is a plan view illustrating a part of the color filter 5 according to the first exemplary embodiment. A shape of the colored portion 51 in plan view is not particularly limited, but the shape is quadrangular in the example illustrated in FIG. 5. In the present exemplary embodiment, one colored portion 51 is disposed so as to correspond to one pixel electrode 23. In other words, the colored portion 51 and the pixel electrode 23 are disposed in a one-to-one manner. Further, each of the colored portions 51 is disposed offset with respect to the corresponding pixel electrode 23 in plan view. The colored portion 51 illustrated in FIG. 5 overlaps a part of the corresponding pixel electrode 23 in plan view. Also, in plan view, the center O5 of the colored portion 51 does not overlap the center O2 of the pixel electrode 23. As described later in detail, the center O5 is located closer to the outer edge of the display region A10 than the center O2. Further, a planar area of the colored portion 51 is greater than a planar area of the pixel electrode 23, but may be equal to or less than the planar area of the pixel electrode 23. The colored portion 51 overlaps a part of the light-emitting region of the pixel electrode 23 in plan view. In other words, the colored portion 51 overlaps a part of any of the opening 245, the opening 246, and the opening 247 in plan view. Further, the planar area of the colored portion 51 is greater than a planar area of the light-emitting portion of the pixel electrode 23. A part of the colored portion 51 may be disposed between the pixel electrode 23 and the lens layer 61.

The planar areas of the plurality of colored portions 51 are equal to each other, but may be different from each other. Further, widths W5 of the plurality of colored portions 51 are equal to each other, but may be different from each other. Note that the width W5 is a length along the +y direction.

As illustrated in FIG. 3, the lens layer 61 having translucency is disposed on the color filter 5. The lens layer 61 includes the plurality of lenses 610. One lens 610 is provided for one sub-pixel P0. The lens 610 protrudes from the color filter 5 toward the transmissive substrate 9. The lens 610 is a microlens including a lens surface 611. The lens surface 611 is a convex surface. Note that the lens 610 may be a so-called spherical lens or a so-called aspherical lens.

Heights T6 of the plurality of lenses 610 are equal to each other, but may be different from each other. Note that the height T6 is a maximum length along the +z direction.

Figure 6:
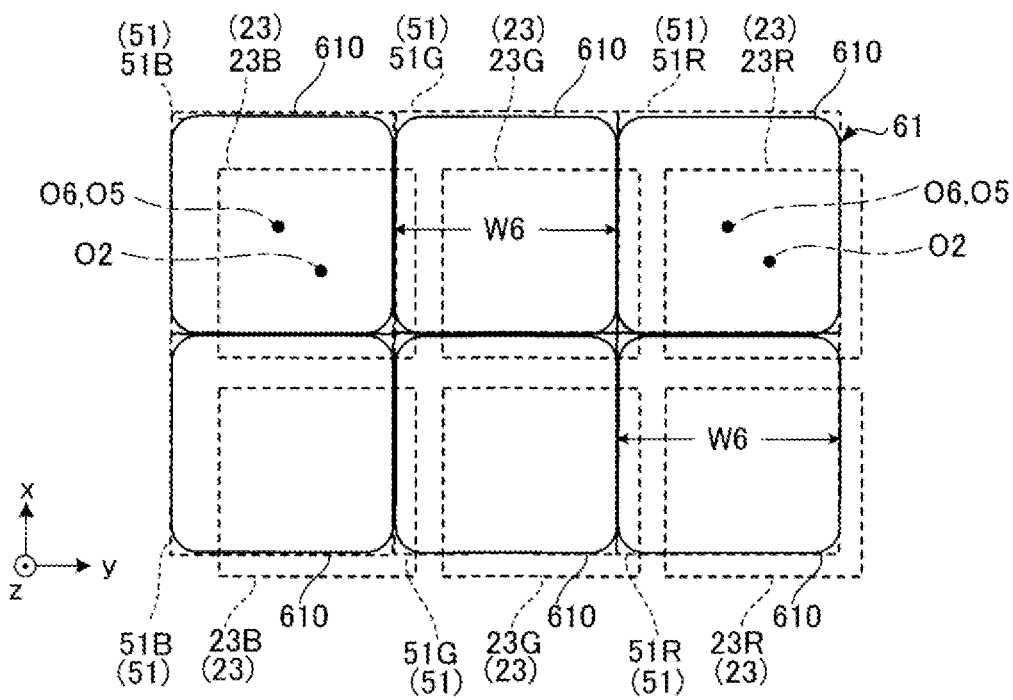
FIG. 6 is a plan view illustrating a part of a lens layer according to the first exemplary embodiment.

FIG. 6 is a plan view illustrating a part of the lens layer 61 according to the first exemplary embodiment. A shape of the lens 610 in plan view is not particularly limited, but the shape is quadrangular with rounded corners in the example illustrated in FIG. 6. The outer edges of the two adjacent lenses 610 are coupled to each other in plan view.

One lens 610 is disposed so as to correspond to one pixel electrode 23. In other words, the lens 610 and the pixel electrode 23 are disposed in a one-to-one manner. Further, each of the lenses 610 is disposed offset with respect to the corresponding pixel electrode 23 in plan view. The lens 610 overlaps a part of the corresponding pixel electrode 23 in plan view. Also, in plan view, the center O6 of the lens 610 does not overlap the center O2 of the pixel electrode 23. As described later in detail, the center O6 is located closer to the outer edge of the display region A10 than the center O2. One lens 610 is disposed so as to correspond to one light-emitting region. The lens 610 overlaps the light-emitting region in plan view. In other words, the lens 610 overlaps any of the opening 245, the opening 246, and the opening 247 in plan view.

Note that, as illustrated in FIG. 3, the lens 610 may overlap the corresponding colored portion 51 and the corresponding pixel electrode 23 in plan view. Overlapping between the lens 610 and the colored portion 51 may be partial. Further, overlapping between the lens 610 and the pixel electrode 23 may be partial. The pixel electrode 23, the colored portion 51, and the lens 610 provided in the sub-pixel may be disposed in this order in a row. A part of the pixel electrode 23, a part of the colored portion 51, and a part of the lens 610 provided in the sub-pixel are located in a straight line.

A planar area of the lens 610 is greater than the planar area of the pixel electrode 23, but may be equal to or less than the planar area of the pixel electrode 23. Further, the planar area of the lens 610 is greater than the planar area of the light-emitting portion of the pixel electrode 23. Further, the planar areas of the plurality of lenses 610 are equal to each other, but may be different from each other. Widths W6 of the plurality of lenses 610 may be equal to each another, but may be different from each other. Note that the width W6 is a length along the +y direction.

As illustrated in FIG. 6, one lens 610 is disposed so as to correspond to one colored portion 51. Further, the lens 610 overlaps the corresponding colored portion 51 in plan view. In the present exemplary embodiment, the center O6 of the lens 610 overlaps the center O5 of the colored portion 51 in plan view. Note that, in the present exemplary embodiment, all of the lenses 610 overlap the colored portion 51, but only a part of the lens 610 may overlap the colored portion 51. In the present exemplary embodiment, the planar area of the lens 610 is equal to the planar area of the colored portion 51, but may be larger or smaller than the planar area of the colored portion 51.

Examples of a constituent material for the lens 610 include materials having translucency and insulating properties. Specific examples of the constituent material for the lens 610 include silicon-based inorganic materials such as silicon oxide, resin materials such as acrylic resin, and the like.

A refractive index of the constituent material for the lens 610 is lower than a refractive index of a constituent material for the light-transmitting layer 62 described later. Specifically, the refractive index of the constituent material for the lens 610 is, for example, equal to or greater than 1.3 and equal to or less than 1.6 with respect to visible light having a wavelength of 550 nm.

As illustrated in FIG. 3, the light-transmitting layer 62 having translucency and insulating properties is disposed on the lens layer 61. The light-transmitting layer 62 contacts the plurality of lens surfaces 611. Further, a surface of the light-transmitting layer 62 in contact with the transmissive substrate 9 is flat.

Examples of the constituent material for the light-transmitting layer 62 include materials having translucency and insulating properties. Specific examples of the constituent material for the light-transmitting layer 62 include resin materials such as epoxy resins. The light-transmitting layer 62 is formed so as to coat the plurality of lens surfaces 611 by using the resin material, and thus it is easy to flatten the surface on the +z-axis side of the light-transmitting layer 62. Further, the constituent material for the light-transmitting layer 62 may be aluminum oxide, and a silicon-based inorganic material such as silicon oxynitride.

The refractive index of the constituent material for the light-transmitting layer 62 is greater than the refractive index of the constituent material for the lens 610. The refractive index of the constituent material for the light-transmitting layer 62 is, for example, equal to or greater than 1.5 and equal to or less than 1.8 with respect to visible light having a wavelength of 550 nm.

Further, as described above, the lens surface 611 is a convex surface, but the refractive index of the constituent material for the lens 610 is lower than the refractive index of the constituent material for the light-transmitting layer 62. Thus, the lens 610 functions as a general concave lens. In other words, the lens 610 spreads light radiated from the corresponding organic EL element 20. The spread of the light will be described later in detail.

The transmissive substrate 9 having translucency is disposed on the light-transmitting layer 62. When the light-transmitting layer 62 described above has adhesive properties, the transmissive substrate 9 is bonded to the element substrate 1 by the light-transmitting layer 62. Note that, when the light-transmitting layer 62 does not have adhesive properties, a member having adhesive properties may be disposed between the light-transmitting layer 62 and the transmissive substrate 9.

In the present exemplary embodiment, a refractive index of the constituent material for the transmissive substrate 9 is lower than the refractive index of the constituent material for the light-transmitting layer 62. The transmissive substrate 9 is formed of, for example, a glass substrate or a quartz substrate. The refractive index of the constituent material for the transmissive substrate 9 is not particularly limited, but is, for example, equal to or greater than 1.4 and equal to or less than 1.6 with respect to visible light having a wavelength of 550 nm. Note that the refractive index of the constituent material for the transmissive substrate 9 may be equal to or greater than the refractive index of the constituent material for the light-transmitting layer 62.

Figure 7:
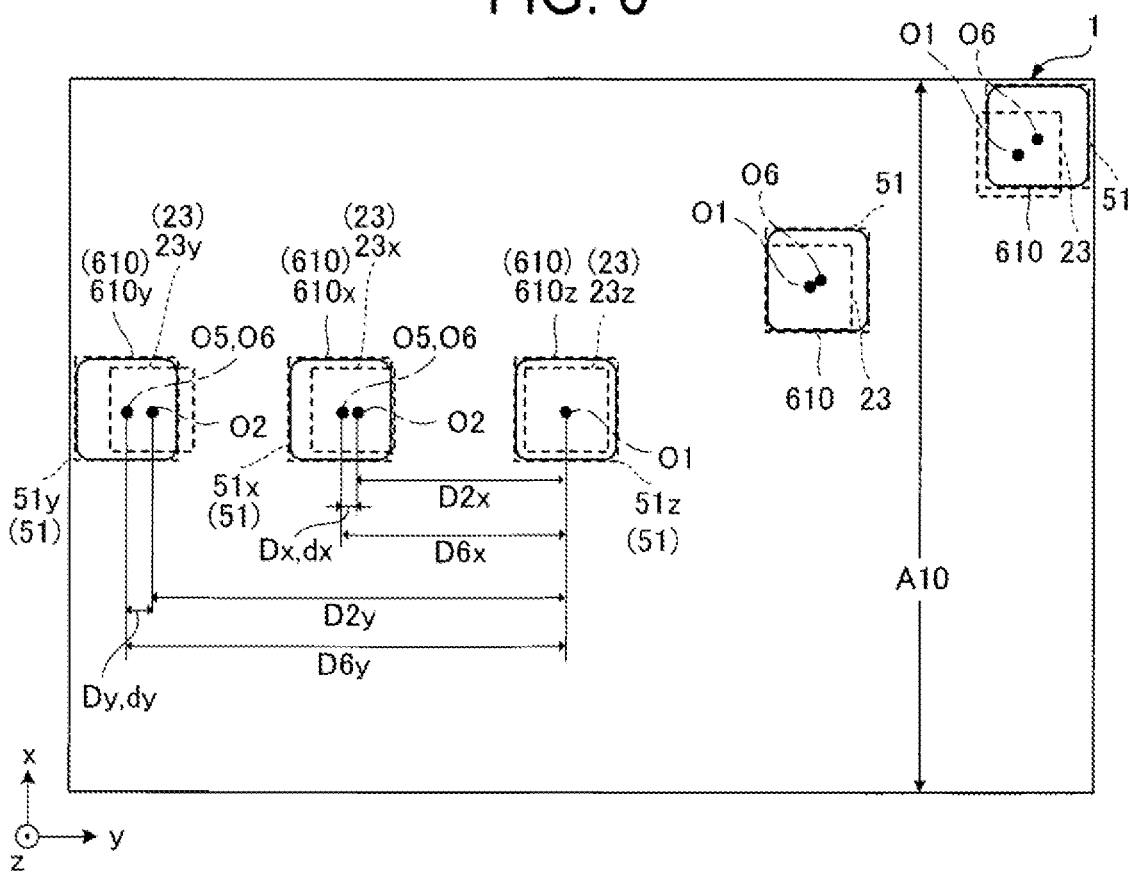
FIG. 7 is a diagram illustrating an arrangement of the pixel electrode, a lens, and a colored portion according to the first exemplary embodiment.

FIG. 7 is a diagram illustrating an arrangement of the pixel electrode 23, the lens 610, and the colored portion 51 according to the first exemplary embodiment. As illustrated in FIG. 7, a positional relationship between the lens 610 and the colored portion 51, and the pixel electrode 23 in plan view varies depending on a location in the display region A10. Note that, in FIG. 7, the pixel electrode 23, the lens 610, and the colored portion 51 are illustrated in an exaggerated manner to facilitate understanding of each of the positional relationships.

In FIG. 7, a display center O1 is located at the center of the display region A10 in plan view. In FIG. 7, the pixel electrode 23 overlapping the display center O1 in plan view is referred to as a "reference pixel electrode 23z", and the lens 610 corresponding to the reference pixel electrode 23z is referred to as a "reference lens 610z". The colored portion 51 overlapping the reference pixel electrode 23z in plan view is referred to as a "reference colored portion 51z". Further, the pixel electrode 23 located closer to the outside than the display center O1 in plan view is referred to as a "first pixel electrode 23x", and the lens 610 corresponding to the first pixel electrode 23x is referred to as a "first lens 610x". The colored portion 51 overlapping the first pixel electrode 23x in plan view is referred to as a "first colored portion 51x". Further, the pixel electrode 23 located closer to the outside than the first pixel electrode 23x in plan view is referred to as a "second pixel electrode 23y", and the lens 610 corresponding to the second pixel electrode 23y is referred to as a "second lens 610y". The colored portion 51 overlapping the second pixel electrode 23y in plan view is referred to as a "second colored portion 51y". Note that, when there is no pixel electrode 23 overlapping the display center O1, the pixel electrode 23 closest to the display center O1 is referred to as a "reference pixel electrode 23z".

As illustrated in FIG. 7, the lens 610 other than the reference lens 610z is located closer to the outside of the display region A10 in plan view than the corresponding pixel electrode 23. Specifically, for example, the first lens 610x is located closer to the outside than the first pixel electrode 23x in plan view. Thus, a distance D2x between the center O2 of the first pixel electrode 23x and the display center O1 is shorter than a distance D6x between the center O6 of the first lens 610x and the display center O1 in plan view. Similarly, the second lens 610y is located closer to the outside than the second pixel electrode 23y in plan view. Thus, a distance D2y between the center O2 of the second pixel electrode 23y and the display center O1 is shorter than a distance D6y between the center O6 of the second lens 610y and the display center O1 in plan view.

Further, in plan view, a distance Dx between the center O2 of the first pixel electrode 23x and the center O6 of the first lens 610x is shorter than a distance Dy between the center O2 of the second pixel electrode 23y and the center O6 of the second lens 610y. In the present exemplary embodiment, in plan view, the lens 610 is shifted toward the outside with respect to the pixel electrode 23 as the lens 610 is closer to the outside than the display center O1. Thus, the distance between the center O2 of the pixel electrode 23 and the center O6 of the lens 610 in plan view increases from the display center O1 toward the outside.

Similarly, in plan view, a distance dx between the center O2 of the first pixel electrode 23x and the center O5 of the first colored portion 51x is shorter than a distance dy between the center O2 of the second pixel electrode 23y and the center O6 of the second lens 610y. In the present exemplary embodiment, in plan view, the colored portion 51 is shifted toward the outside with respect to the pixel electrode 23 as the colored portion 51 is closer to the outside than the display center O1. Thus, the distance between the center O2 of the pixel electrode 23 and the center O5 of the colored portion 51 in plan view increases from the display center O1 toward the outside.

Figure 8:
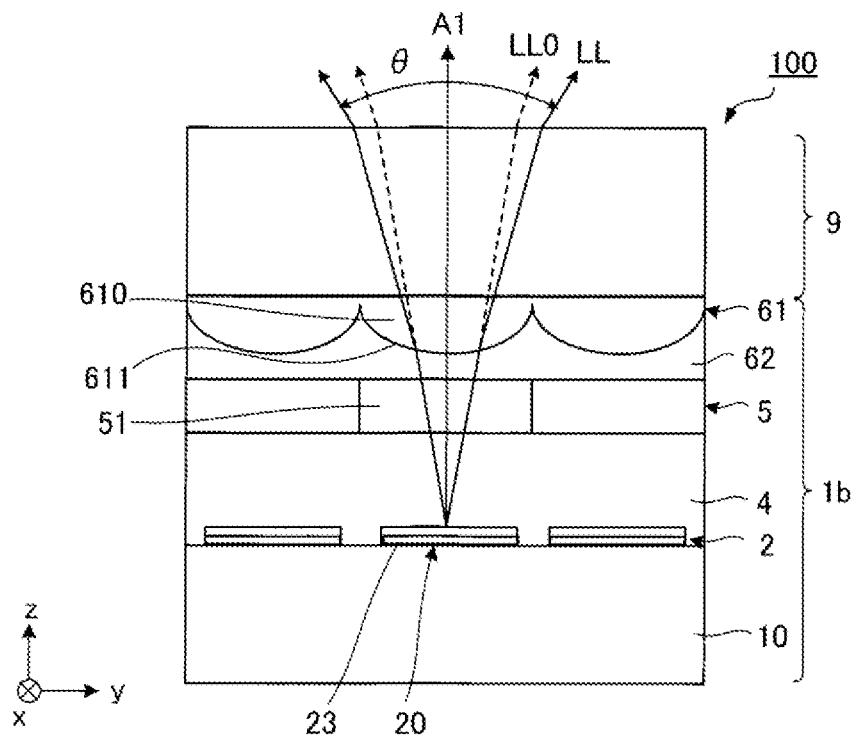
FIG. 8 is a diagram illustrating a light path according to the first exemplary embodiment.

Next, a light path of light radiated from the organic EL element 20 will be described. FIG. 8 is a diagram illustrating the light path according to the first exemplary embodiment. In FIG. 8, the vicinity of the display center O1 is schematically illustrated. As illustrated in FIG. 8, the light radiated from the organic EL element 20 is radiated at a radiation angle θ when the light is emitted from the transmissive substrate 9 to the outside. In FIG. 8, a luminous flux LL of the light radiated from one point of the organic EL element 20 provided in one sub-pixel P0 is illustrated. The radiation angle θ is a solid angle of the luminous flux LL, and is an angle at which the light spreads around a principal ray A1 that is a peak of the intensity of the light.

As described above, the refractive index of the constituent material for the lens 610 is lower than the refractive index of the constituent material for the light-transmitting layer 62. Thus, a refractive angle at the lens surface 611 is greater than an incident angle. Accordingly, the luminous flux LL is refracted by the lens surface 611 and thus spreads closer to the outside than a luminous flux LL0 indicated by a broken line. The luminous flux LL0 is a luminous flux when the lens surface 611 is not provided and the lens layer 61 is formed of the same material as the light-transmitting layer 62. In this way, by providing the lens 610, the radiation angle θ in the sub-pixel P0 can be increased as compared to a case in which the lens 610 is not provided. Furthermore, the refractive index of the air outside is smaller than the refractive index of the constituent material for the transmissive substrate 9. Therefore, the luminous flux LL of the light refracted by the lens surface 611 is refracted by the surface of the transmissive substrate 9, and thus further spreads closer to the outside than the luminous flux LL0. Thus, the radiation angle θ can be increased further than that when the transmissive substrate 9 is not provided.

Figure 9:
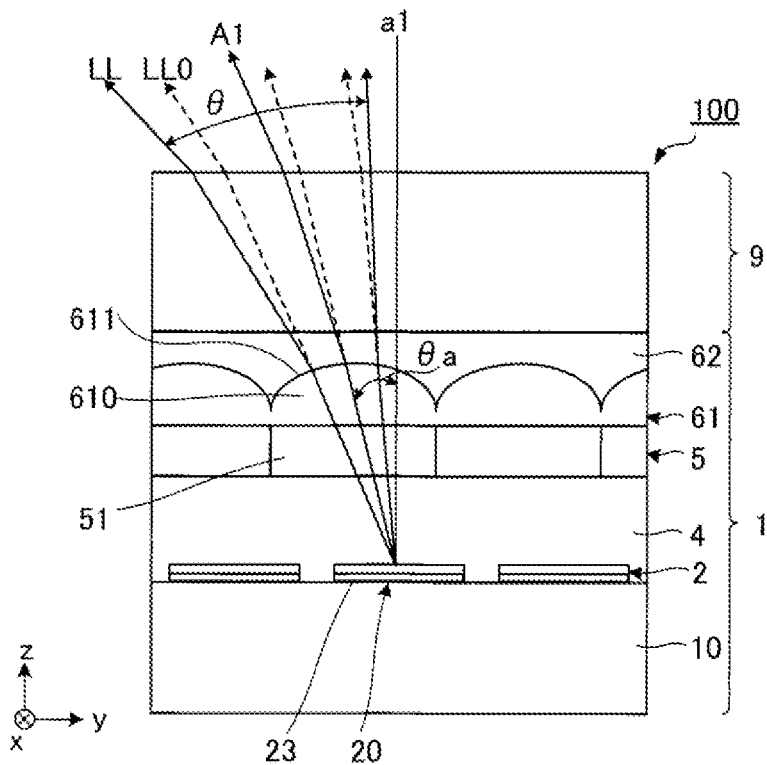
FIG. 9 is a diagram illustrating the light path according to the first exemplary embodiment.

FIG. 9 is a diagram illustrating the light path according to the first exemplary embodiment. In FIG. 9, the vicinity of the outer edge of the display region A10 is schematically illustrated. As described above, in the vicinity of the outer edge of the display region A10, the corresponding colored portion 51 is located closer to the outside with respect to the pixel electrode 23. Thus, as illustrated in FIG. 9, the principal ray A1 can be inclined with respect to a normal line a1 of the pixel electrode 23. In other words, an inclination angle θa of the principal ray A1 increases. The inclination angle θa is an angle formed by the normal line a1 of the pixel electrode 23 and the principal ray A1. Note that the principal ray A1 is inclined to the opposite side from the display center O1. Then, the lens 610 can spread the luminous flux LL closer to the outside than the luminous flux LL0 while the principal ray A1 is inclined. Furthermore, the luminous flux LL of the light refracted by the lens surface 611 is refracted by the surface of the transmissive substrate 9, and can thus further spread closer to the outside than the luminous flux LL0.

As described above, the display device 100 includes the substrate 10, the lens layer 61 including the lens 610, the pixel electrode 23, and the color filter 5 including the colored portion 51. Then, the colored portion 51 overlaps a part of the pixel electrode 23 in plan view. Further, as described above, the colored portion 51 is located closer to the outside with respect to the display center O1 than the pixel electrode 23 in plan view. Thus, as described above, the principal ray A1 can be inclined outward. Accordingly, a visual field angle characteristic can be enhanced.

Furthermore, one pixel electrode 23 and one lens 610 are provided for one sub-pixel P0. Specifically, one lens 610 is disposed so as to correspond to one pixel electrode 23, and overlaps a part of the corresponding pixel electrode 23 in plan view. The radiation angle θ of the light emitted from each of the sub-pixels P0 can be increased by providing the lens 610 for each sub-pixel P0. Then, the lens 610 is located closer to the outside with respect to the display center O1 in plan view than the corresponding pixel electrode 23. Thus, in a configuration in which the principal ray A1 is inclined outward, the radiation angle θ can be increased. Therefore, the visual field angle characteristic of the display device 100 can be further enhanced. In other words, a range of a visual field angle at which viewing is allowed without image quality changes such as a color shift can be extended.

Further, the lens 610 is disposed on the +z-axis side with respect to the color filter 5. Thus, the lens 610 can increase the radiation angle θ of light with high color purity that has the principal ray A1 being inclined outward and is transmitted through the color filter. Accordingly, the visual field angle characteristic can be enhanced further than that when the lens 610 is disposed on the −z-axis side with respect to the color filter 5.

In the present exemplary embodiment, the lens 610 is provided in all of the sub-pixels P0. Thus, the display device 100 particularly has an excellent visual field angle characteristic. Note that the lens 610 may not be provided in some of all of the sub-pixels P0.

Further, the colored portion 51 overlaps the lens 610 in plan view. For this reason, light transmitted through the color filter 5 can be efficiently incident on the lens 610. Thus, in a configuration in which the principal ray A1 is inclined outward, the radiation angle θ can be effectively increased.

Further, as illustrated in FIG. 7, the distance dx between the center O2 of the first pixel electrode 23x and the center O5 of the first colored portion 51x is shorter than the distance dy between the center O2 of the second pixel electrode 23y and the center O6 of the second colored portion 51y. Thus, the principal ray A1 of light emitted from the organic EL element 20 located outside the display region A10 can be inclined outward farther than the principal ray A1 emitted from the organic EL element 20 located closer to the inside. Furthermore, the distance Dx between the center O2 of the first pixel electrode 23x and the center O6 of the first lens 610x is shorter than the distance Dy between the center O2 of the second pixel electrode 23y and the center O6 of the second lens 610y. Thus, the radiation angle θ can be increased in a configuration in which the principal ray A1 is inclined outward farther as the light located closer to the outside. For this reason, a visual field angle characteristic can be further enhanced.

Furthermore, in the present exemplary embodiment, in plan view, the colored portion 51 is shifted toward the outside with respect to the pixel electrode 23 as the colored portion 51 is closer to the outside than the display center O1. Similarly, in plan view, the lens 610 is shifted toward the outside with respect to the pixel electrode 23 as the lens 610 is closer to the outside than the display center O1. For this reason, the inclination angle θa of the principal ray A1 can be increased further in a position closer to the outside than the display center O1 in plan view. Thus, changes in luminance and chromaticity depending on an angle at which the display device 100 is viewed can be reduced.

Also, as described above, the lens 610 includes the convex lens surface 611. Thus, as described above, the luminous flux LL can be spread by the lens surface 611. Further, since a shape of the lens 610 is convex, formation of the lens 610 is easier than that when the shape is concave. Note that the formation method will be described below in detail.

Further, as described above, the lens surface 611 of the lens 610 is convex, but the refractive index of the constituent material for the lens 610 is lower than the refractive index of the constituent material for the light-transmitting layer 62. Thus, as illustrated in FIGS. 8 and 9, the luminous flux LL can be spread by the lens surface 611.

Further, as described above, the lens layer 61 is disposed between the substrate 10 and the light-transmitting layer 62. By disposing them in this order, when each layer is formed so as to be laminated from the substrate 10 side, the convex lens 610 is easily formed on the color filter 5.

Furthermore, the lens layer 61 contacts the color filter 5. The lens layer 61 contacts the color filter 5, and thus light transmitted through the color filter 5 can be efficiently incident on the lens 610 as compared to a case in which other members are disposed between the lens layer 61 and the color filter 5. Thus, the utilization efficiency of the light transmitted through the color filter 5 can be increased.

Note that other members may be disposed between each of the color filter 5, the lens layer 61, the light-transmitting layer 62, and the transmissive substrate 9. However, these may be laminated. By laminating them, the light transmitted through the color filter 5 can be efficiently incident on the lens 610, and the light transmitted through the lens 610 can also be efficiently emitted to the outside.

As illustrated in FIG. 6, the planar area of the lens 610 may be greater than the planar area of the pixel electrode 23. Such a configuration allows light generated from the organic EL element 20 to be efficiently incident on the lens 610. Thus, the bright display device 100 having the wide radiation angle θ can be achieved.

Further, the display device 100 according to the present exemplary embodiment includes the organic EL element 20. In other words, the display device 100 further includes the pixel electrode 23, the common electrode 25, and the light-emitting layer 240 disposed between the pixel electrode 23 and the common electrode 25. The display device 100 includes the organic EL element 20, and thus an organic EL display device is formed. Thus, the organic EL display device having an excellent visual field angle characteristic can be achieved by providing the lens 610 and the light-transmitting layer 62.

Furthermore, the display device 100 has the light resonance structure. With the light resonance structure, light can be increased in intensity and a spectrum of the light can be narrowed. For this reason, the display device 100 having the light resonance structure includes the lens 610, and thus an effect of expanding the radiation angle θ by the lens surface 611 is exhibited particularly suitably, and the visual field angle characteristic is further enhanced.

Further, when the principal ray A1 is inclined outward with respect to the normal line a1 as described above, the optical distance L0 increases, and a resonant condition shifts to a short wavelength side. Thus, by changing the arrangement of the colored portion 51 and the lens 610 to the outside, the principal ray A1 can be set to a condition close to the resonance condition when the principal ray A1 is parallel to the normal line a1. Thus, shifting of the resonant condition to the short wavelength side can be suppressed. As a result, uneven color and the like can be reduced.

1B. Method for Manufacturing Display Device 100

Figure 10:
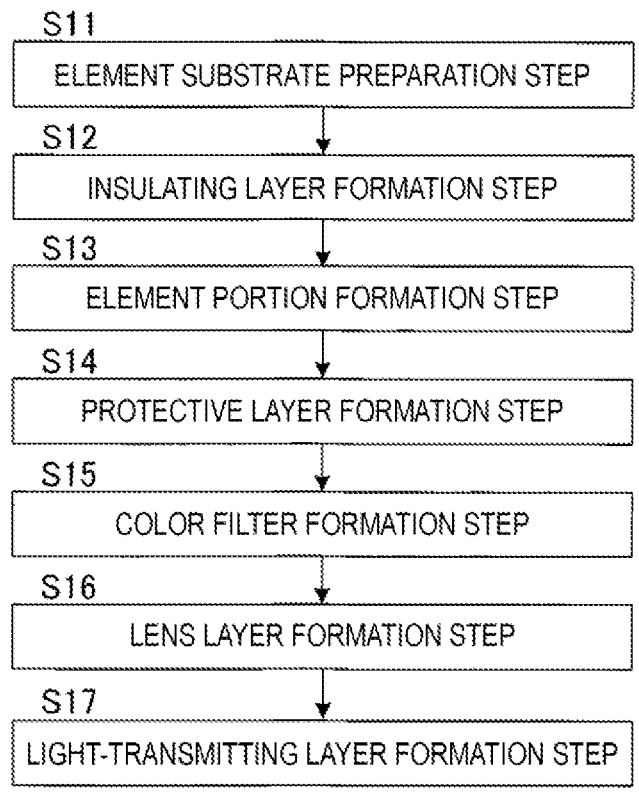
FIG. 10 is a flow of a method for manufacturing a display device according to the first exemplary embodiment.

FIG. 10 is a flow of a method for manufacturing the display device 100 according to the first exemplary embodiment. As illustrated in FIG. 10, the method for manufacturing the display device 100 includes an element substrate preparation step S11, an insulating layer formation step S12, an element portion formation step S13, a protective layer formation step S14, a color filter formation step S15, a lens layer formation step S16, and a light-transmitting layer formation step S17. The display device 100 is manufactured by performing the steps in this order.

In the element substrate preparation step S11, the substrate 10 and the reflection layer 21 that are described above are formed. In the insulating layer formation step S12, the insulating layer 22 is formed. In the element portion formation step S13, the element portion 2 is formed on the insulating layer 22. In other words, the plurality of organic EL elements 20 are formed. In the protective layer formation step S14, the protective layer 4 is formed. In the color filter formation step S15, the color filter 5 is formed. The element substrate 1, the reflection layer 21, the element portion 2, the protective layer 4, and the color filter 5 are formed by a known technique.

Figure 11:
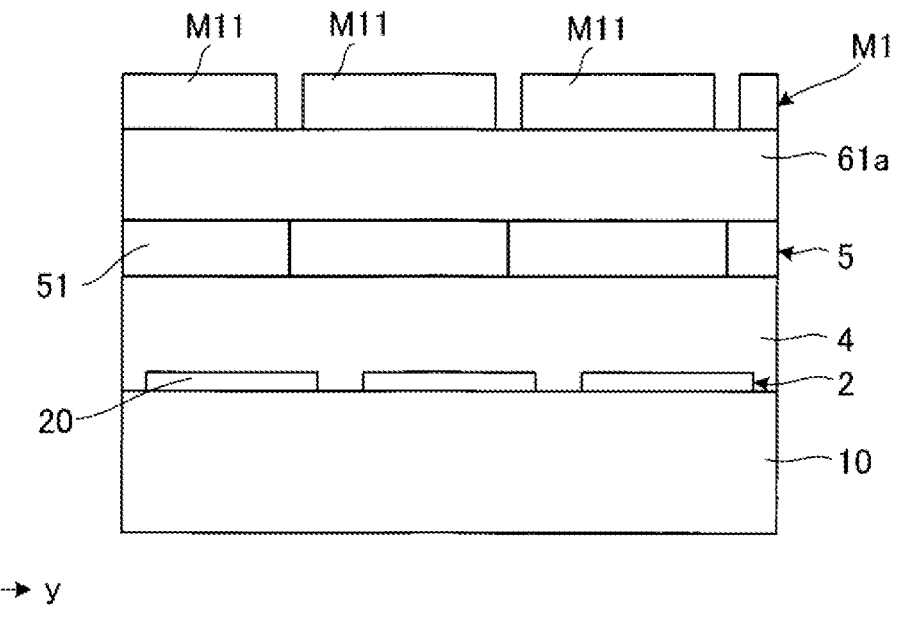
FIG. 11 is a diagram illustrating a lens layer formation step according to the first exemplary embodiment.

FIGS. 11, 12, 13, and 14 are each a diagram illustrating the lens layer formation step S16 according to the first exemplary embodiment. First, as illustrated in FIG. 11, a lens material layer 61*a* is formed by depositing a lens forming composition on the color filter 5. The lens forming composition is, for example, a silicon-based inorganic material such as silicon oxide, a resin material such as acrylic resin, and the like. The formation of the lens material layer 61*a* uses, for example, a CVD method. Next, a mask M1 is formed on the lens material layer 61*a*. The mask M1 includes a plurality of pattern portions M11. Each of the pattern portions M11 corresponds to a position in which the lens 610 is formed. The mask M1 is formed by using, for example, a positive photosensitive resist in which an exposed portion is removed by development. The plurality of pattern portions M11 are formed by patterning by a photolithography technique.

Figure 12:
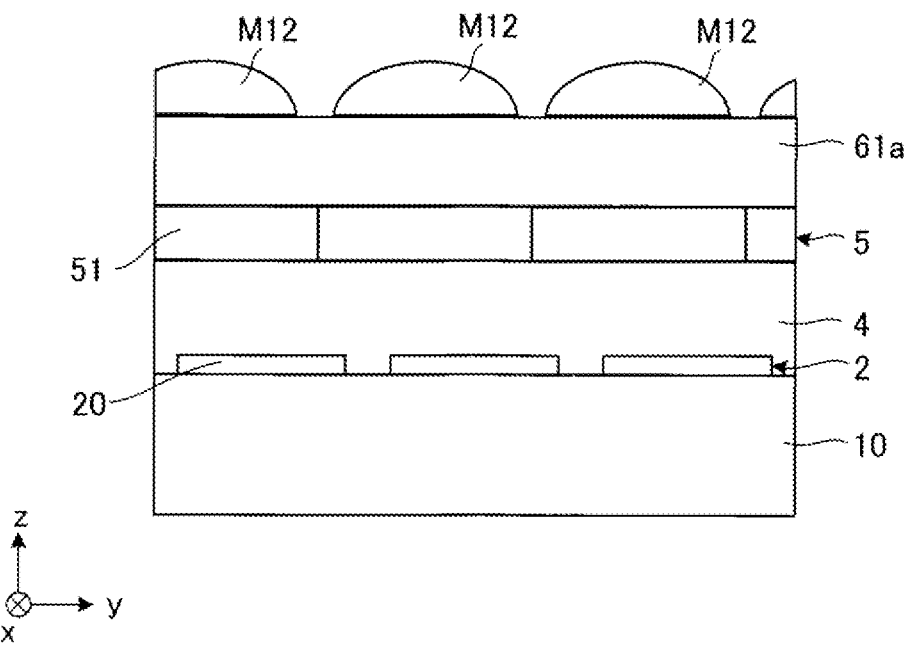
FIG. 12 is a diagram illustrating the lens layer formation step according to the first exemplary embodiment.

Next, the mask M1 is melted by performing heat treatment such as reflow treatment on the mask M1. The mask M1 is melted to be in a fluid state, and a surface is deformed into a curved surface due to the action of surface tension. The surface is deformed, and thus a plurality of convex portions M12 are formed on the lens material layer 61*a*, as illustrated in FIG. 12. One convex portion M12 is formed from one pattern portion M11. A shape of the convex portion M12 is substantially hemispherical.

Figure 13:
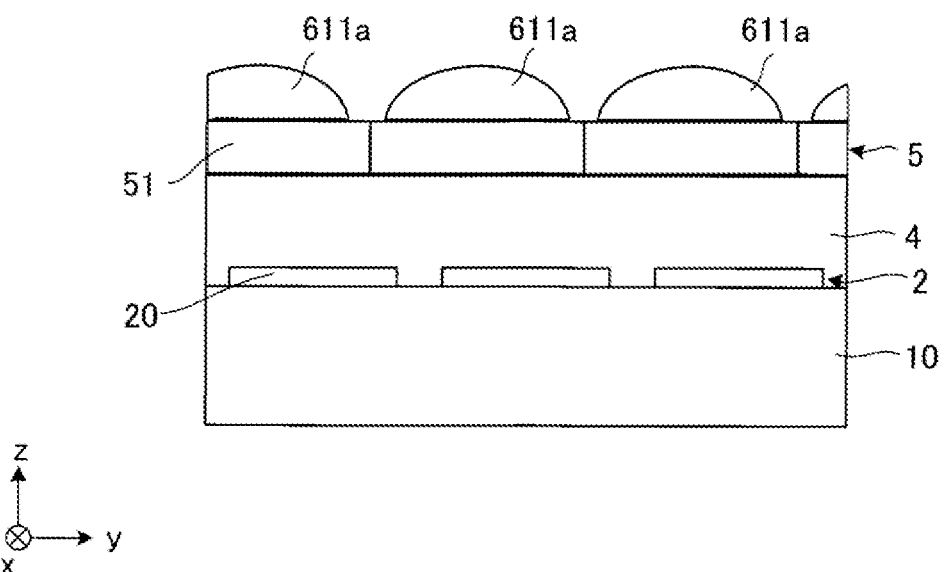
FIG. 13 is a diagram illustrating the lens layer formation step according to the first exemplary embodiment.
Figure 14:
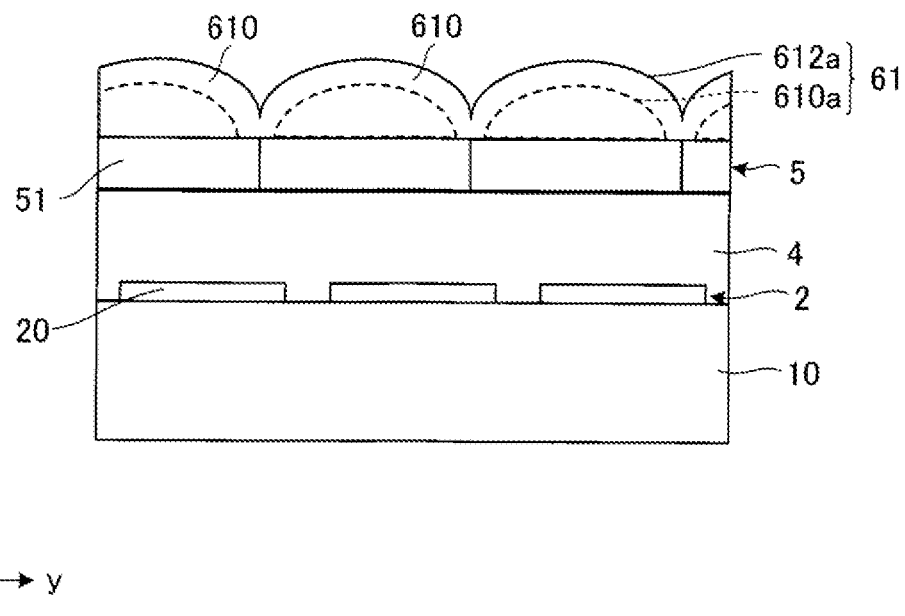
FIG. 14 is a diagram illustrating the lens layer formation step according to the first exemplary embodiment.

Next, anisotropic etching such as dry etching, for example, is performed on the convex portion M12 and the lens material layer 61*a*. In this way, the convex portion M12 is removed, and the exposed portion of the lens material layer 61*a* is etched due to the removal of the convex portion M12. As a result, the shape of the convex portion M12 is transferred to the lens material layer 61*a*, and a plurality of lens convex portions 611*a* are formed as illustrated in FIG. 13. Next, the same material as the lens material layer 61*a*, namely, the lens convex portion 611*a*, is deposited on the lens convex portion 611*a* by using, for example, the CVD method. As a result, as illustrated in FIG. 14, a lens coat 612*a* is formed on the plurality of lens convex portions 611*a*. Thus, the lens layer 61 constituted of the plurality of lens convex portions 611*a* and the lens coat 612*a* is formed.

Note that, as a method for processing the mask M1 into a shape of the convex portion M12, for example, a method of exposure by using a gray scale mask and the like, a method of multistage exposure, or the like may be used. Note that the mask is used in the description above, but the lens 610 may be formed directly from a resin material such as acrylic resin by using the photolithography technique.

Figure 15:
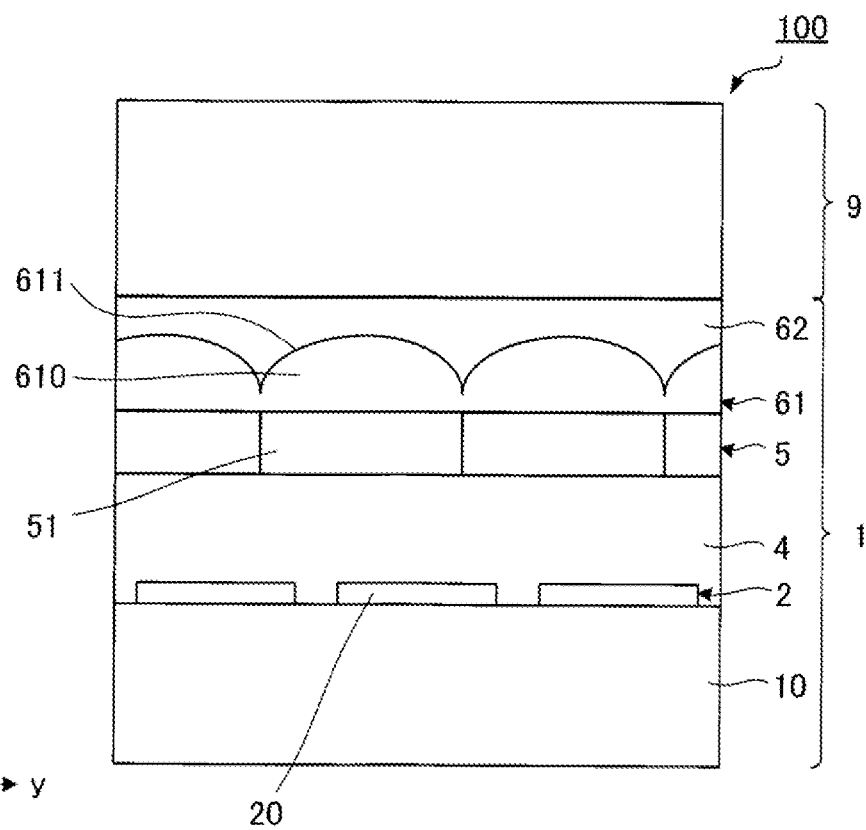
FIG. 15 is a diagram illustrating a light-transmitting layer formation step according to the first exemplary embodiment.

FIG. 15 is a diagram illustrating the light-transmitting layer formation step S17 according to the first exemplary embodiment. As illustrated in FIG. 15, in the light-transmitting layer formation step S17, the light-transmitting layer 62 is formed by depositing a light-transmitting layer forming composition on the lens layer 61. The light-transmitting layer forming composition has a refractive index greater than a refractive index of the lens forming composition described above.

For example, when the light-transmitting layer forming composition is an adhesive having adhesive properties, the light-transmitting layer forming composition is deposited on the lens layer 61. Subsequently, the transmissive substrate 9 is pressed onto the deposited light-transmitting layer forming composition, and the light-transmitting layer forming composition is cured. According to this method, the light-transmitting layer 62 is formed, and the transmissive substrate 9 is also bonded to the element substrate 1. Note that, when the light-transmitting layer 62 does not have adhesive properties, an adhesive layer that bonds the light-transmitting layer 62 and the transmissive substrate 9 together is provided therebetween.

According to the method described above, the display device 100 can be easily and quickly formed. Further, since the shape of the lens 610 is convex, it is easy to form the lens 610 by using the photolithography technique or the like as described above. For this reason, the lens layer 61 can be formed easily and with high accuracy as compared to a case in which the shape of the lens 610 is concave. Also, even when a constituent material for the lens layer 61 is an inorganic material, it is easy to form the convex lens 610 by using the photolithography technique or the like. Further, the alignment of the colored portion 51 and the lens 610 can be particularly easily performed by forming the lens layer 61 on the color filter 5. Furthermore, the alignment between the pixel electrode 23 and the colored portion 51 can be suitably performed by forming the color filter 5 via the protective layer 4 having translucency on the pixel electrode 23.

2. Second Exemplary Embodiment

Figure 16:
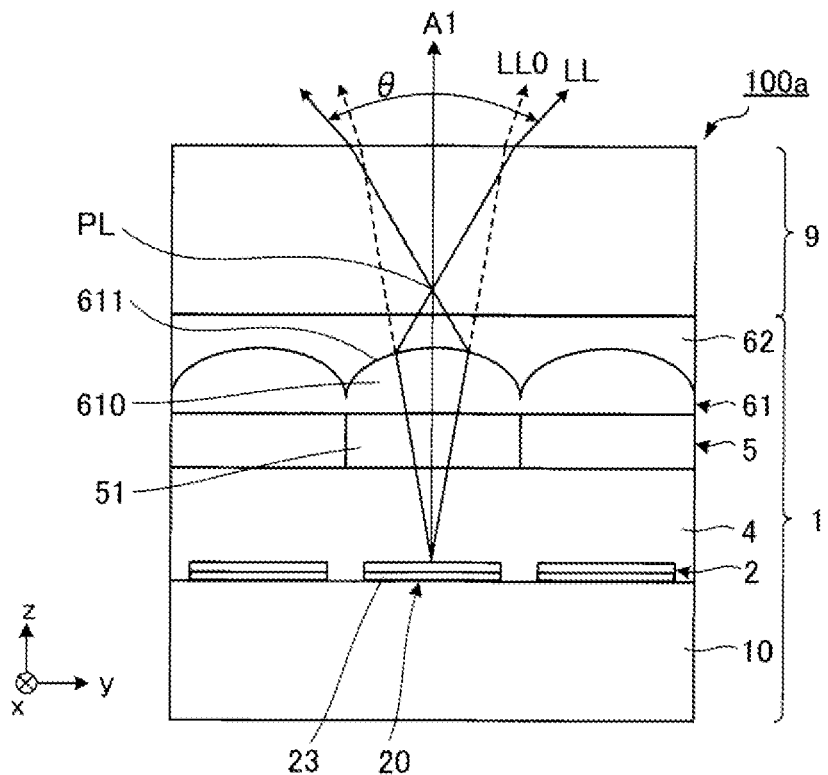
FIG. 16 is a diagram schematically illustrating a display device according to a second exemplary embodiment.
Figure 17:
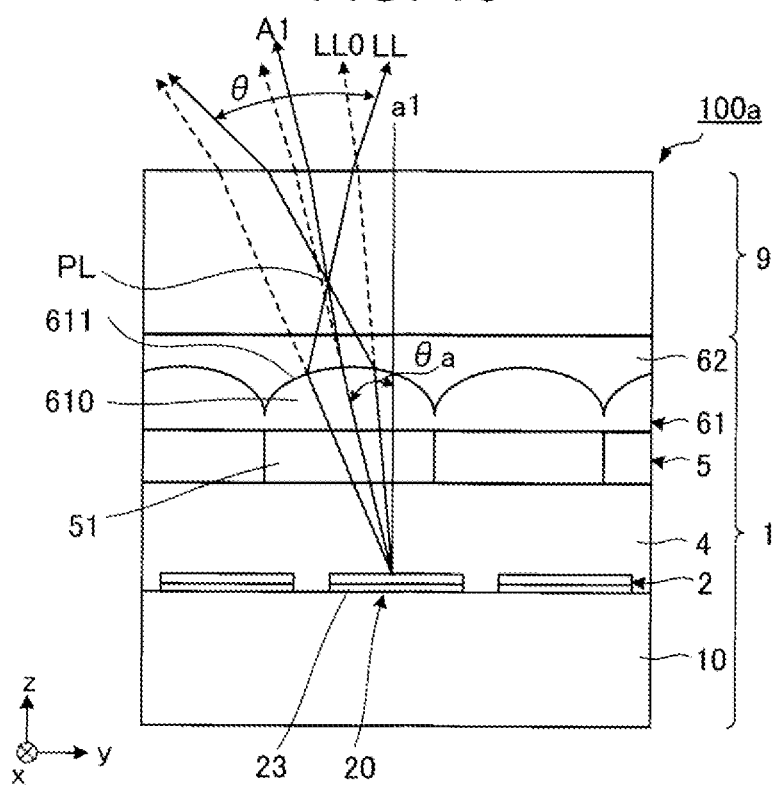
FIG. 17 is a diagram schematically illustrating the display device according to the second exemplary embodiment.

Next, a second exemplary embodiment of the present disclosure will be described. FIGS. 16 and 17 are each a diagram schematically illustrating a display device 100a according to a second exemplary embodiment. In FIG. 16, the vicinity of the display center O1 is schematically illustrated. In FIG. 17, the vicinity of an outer edge of a display region A10 is schematically illustrated. In the present exemplary embodiment, a relationship between a refractive index of a constituent material for a lens 610 and a refractive index of a constituent material for a light-transmitting layer 62 is different from that in the first exemplary embodiment. Note that, in the second exemplary embodiment, a sign used in the description of the first exemplary embodiment is used for the same matter as that of the first exemplary embodiment, and each detailed description thereof will be appropriately omitted.

In the present exemplary embodiment, the refractive index of the constituent material for the lens 610 illustrated in FIG. 16 is higher than the refractive index of the constituent material for the light-transmitting layer 62. Specifically, the refractive index of the constituent material for the lens 610 is, for example, equal to or greater than 1.5 and equal to or less than 1.8 with respect to visible light having a wavelength of 550 nm. On the other hand, the refractive index of the constituent material for the light-transmitting layer 62 is, for example, equal to or greater than 1.3 and equal to or less than 1.6 with respect to visible light having a wavelength of 550 nm.

Examples of the constituent material for the lens 610 include materials having translucency and insulating properties. Specific examples of the constituent material for the lens 610 include resin materials such as epoxy resins. Further, the constituent material for the lens 610 may be an inorganic material such as aluminum oxide and a silicon-based inorganic material, such as silicon oxynitride. On the other hand, examples of the constituent material for the light-transmitting layer 62 include silicon-based inorganic materials such as silicon oxide, resin materials such as acrylic resin, and the like. The light-transmitting layer 62 is formed so as to coat the plurality of lens surfaces 611 by using the resin material, and thus it is easy to flatten the surface on the +z-axis side of the light-transmitting layer 62.

As described above, the refractive index of the constituent material for the lens 610 is higher than the refractive index of the constituent material for the light-transmitting layer 62. Thus, a refractive angle at the lens surface 611 is smaller than an incident angle. Accordingly, a luminous flux LL is refracted by the lens surface 611 and thus converges closer to the inside than a luminous flux LL0 indicated by a broken line. Further, in the present exemplary embodiment, a focal point of the lens 610 on the transmissive substrate 9 side is located inside the transmissive substrate 9. Thus, a position PL in which the luminous flux LL illustrated in FIG. 16 is transmitted through the lens 610 and converges is located inside the transmissive substrate 9. In other words, the luminous flux LL converges inside the transmissive substrate 9. Subsequently, the luminous flux LL spreads again inside the transmissive substrate 9. Further, the luminous flux LL of light refracted by the lens surface 611 is refracted by the surface of the transmissive substrate 9, and thus further spreads closer to the outside than the luminous flux LL0.

Further, as described above, in the vicinity of the outer edge of the display region A10, a corresponding colored portion 51 is located closer to the outside with respect to a pixel electrode 23. Thus, as illustrated in FIG. 17, a principal ray A1 can be inclined with respect to a normal line a1 of the pixel electrode 23. Then, the lens 610 can spread the luminous flux LL closer to the outside than the luminous flux LL0 in the end while the principal ray A1 is inclined. Thus, in the present exemplary embodiment, a visual field angle characteristic of the display device 100 can also be enhanced.

Note that the focal point of the lens 610 on the transmissive substrate 9 side may be located outside the display device 100 without being located inside the transmissive substrate 9. In this case, for example, in a virtual image display device 900 described later, an angle of view θ1 can be widened by disposing an eyepiece 90 in a place where the luminous flux LL converges and then spreads again.

3. Third Exemplary Embodiment

Figure 18:
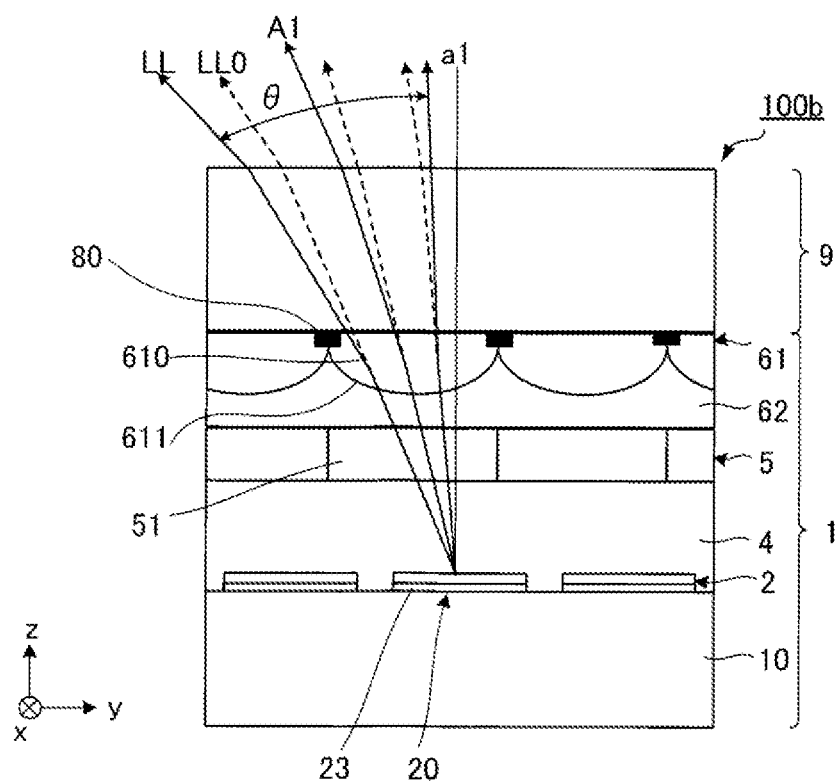
FIG. 18 is a diagram schematically illustrating a display device according to a third exemplary embodiment.
Figure 19:
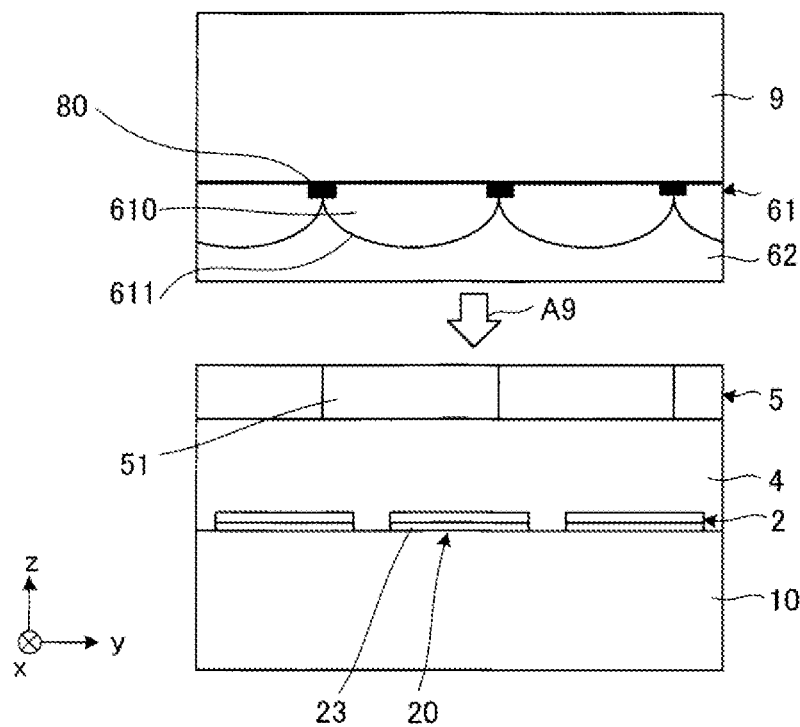
FIG. 19 is a diagram illustrating a method for manufacturing a display device according to the third exemplary embodiment.

Next, a third exemplary embodiment of the present disclosure will be described. FIG. 18 is a diagram schematically illustrating a display device 100b according to the third exemplary embodiment. FIG. 19 is a diagram illustrating a method for manufacturing the display device 100b according to the third exemplary embodiment. The present exemplary embodiment is different from the first exemplary embodiment in that an arrangement of a lens layer 61 and a light-transmitting layer 62 is different and that a black matrix 80 is provided. Note that, in the third exemplary embodiment, a sign used in the description of the first exemplary embodiment is used for the same matter as that of the first exemplary embodiment, and each detailed description thereof will be appropriately omitted.

In the display device 100b illustrated in FIG. 18, the light-transmitting layer 62 and the lens layer 61 are arranged in this order from a color filter 5 toward a transmissive substrate 9. In other words, the light-transmitting layer 62 is disposed between a substrate 10 and the lens layer 61. Further, a lens 610 protrudes from the transmissive substrate 9 toward the color filter 5. Further, in the present exemplary embodiment, similarly to the first exemplary embodiment, a refractive index of a constituent material for the lens 610 is also lower than a refractive index of a constituent material for the light-transmitting layer 62. The lens surface 611 also spreads a luminous flux LL in the arrangement of the light-transmitting layer 62 and the lens layer 61 illustrated in FIG. 18. Thus, in the present exemplary embodiment, similarly to the first exemplary embodiment, a radiation angle θ can also be increased by providing the lens 610 as compared to a case in which the lens 610 is not provided. Therefore, a visual field angle characteristic of the display device 100 can be enhanced. Furthermore, the radiation angle θ can be further increased by providing the transmissive substrate 9.

Further, the so-called black matrix 80 having light shielding properties is disposed between the lenses 610. By disposing the black matrix 80, light transmitted through a colored portion 51 provided in a certain sub-pixel P0 can be reduced or prevented from being incident on the lens 610 provided in the sub-pixel P0 adjacent to the certain sub-pixel P0. Note that another black matrix different from the black matrix 80 may be disposed between the colored portions 51 in order to prevent color mixing between the colored portions 51 adjacent to each other.

As illustrated in FIG. 19, in the manufacturing of the display device 100b, the lens layer 61 is formed on the transmissive substrate 9. Note that the black matrix 80 is formed on a surface of the transmissive substrate 9 before the lens layer 61 is formed. Further, a method similar to the method described in the first exemplary embodiment is used as a method for forming the lens layer 61. After the lens layer 61 is formed, a deposition layer 62a formed of a light-transmitting layer forming composition is formed on the lens layer 61. Subsequently, the deposition layer 62a is pressed against the color filter 5 by moving the transmissive substrate 9 in a direction of an arrow A9. Then, in the pressed state, the deposition layer 62a is cured. The light-transmitting layer 62 is bonded to the color filter 5 by curing the deposition layer 62a. Note that, when the light-transmitting layer 62 does not have adhesive properties, an adhesive layer that bonds the light-transmitting layer 62 and the color filter 5 is provided therebetween.

According to this method, by forming the lens layer 61 on the surface of the transmissive substrate 9, the plurality of convex lenses 610 can be formed easily and with high accuracy on the transmissive substrate 9 by using the photolithography technique or the like. Further, since the lens layer 61 is formed on the transmissive substrate 9, an influence of heat and the like on an organic EL element 20 is reduced even when the organic EL element 20 has poor heat resistance.

Further, in the present exemplary embodiment, the refractive index of the constituent material for the lens 610 is lower than the refractive index of the constituent material for the light-transmitting layer 62, but the refractive index of the constituent material for the lens 610 may be higher than the refractive index of the constituent material for the light-transmitting layer 62. Even in this case, similarly to the second exemplary embodiment, the radiation angle θ can be increased in the end, and thus a visual field angle characteristic of the display device 100 can be enhanced.

4. Fourth Exemplary Embodiment

Figure 20:
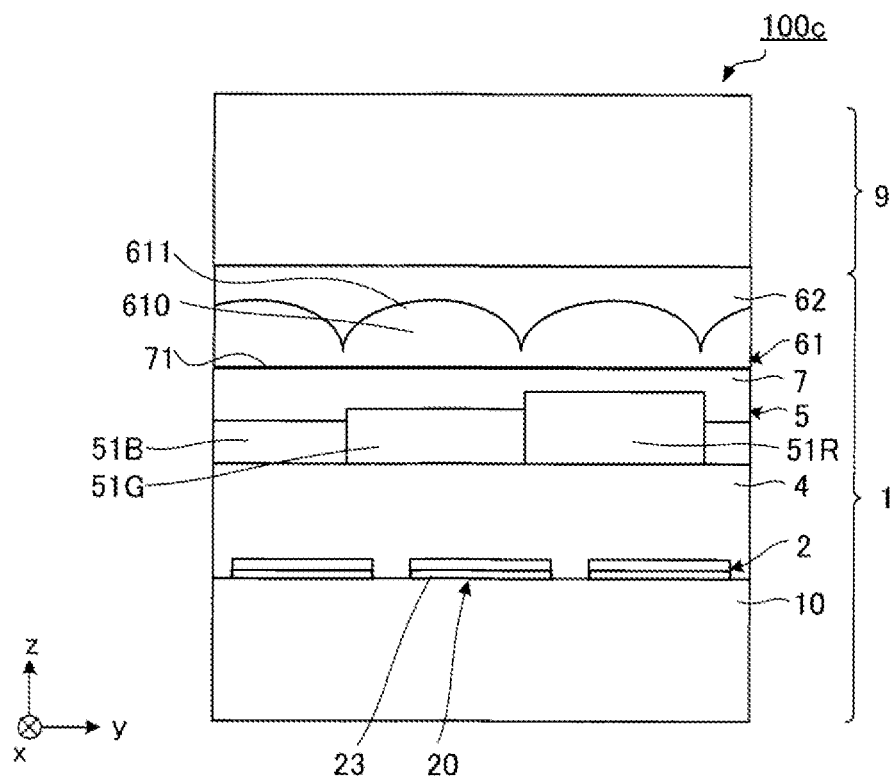
FIG. 20 is a diagram schematically illustrating a display device according to a fourth exemplary embodiment.

Next, a fourth exemplary embodiment of the present disclosure will be described. FIG. 20 is a diagram illustrating a display device 100c according to the fourth exemplary embodiment. The present exemplary embodiment is different from the first exemplary embodiment in that colored portions 51B, 51G, and 51R have different thicknesses and that a flattening layer 7 is provided. Note that, in the second exemplary embodiment, a sign used in the description of the first exemplary embodiment is used for the same matter as that of the first exemplary embodiment, and each detailed description thereof will be appropriately omitted.

In the display device 100c illustrated in FIG. 20, the colored portions 51B, 51G, and 51R have thicknesses different from one another. For example, each thickness is adjusted such that appropriate chromaticity and the like are acquired. Herein, the colored portions 51B, 51G, and 51R having the thicknesses different from one another are formed on a protective layer 4 including a flat surface, and thus a surface on the +z-axis side of a color filter 5 has irregularities. Thus, it becomes difficult to form a lens layer 61 on the surface on the +z-axis side of the color filter 5. Thus, in the display device 100c according to the present exemplary embodiment, the flattening layer 7 having translucency is disposed on the color filter 5. In other words, the flattening layer 7 is disposed between the color filter 5 and the lens layer 61.

A surface on the +z-axis side of the flattening layer 7 is a flat surface 71. The flat surface 71 contacts the lens layer 61. The flattening layer 7 relieves the irregularities of the color filter 5. Thus, by providing the flattening layer 7, the lens layer 61 can be formed without being influenced by the irregularities on the surface on the +z-axis side of the color filter 5.

The flattening layer 7 is constituted of, for example, an inorganic layer formed of an inorganic material, an organic layer formed of an organic layer, or a laminated layer of an inorganic layer and an organic layer.

5. Modified Example

Each of the exemplary embodiments exemplified in the above can be variously modified. Specific modification aspects applied to each of the embodiments described above are exemplified below. Two or more modes freely selected from exemplifications below can be appropriately used in combination as long as mutual contradiction does not arise.

5-1. First Modified Example

In each of the exemplary embodiments described above, the organic EL element 20 has the light resonance structure having a resonance length varying for color, but may not have the light resonance structure. The element portion 2 may include, for example, a partition wall that partitions the functional layer 24 for each of the organic EL elements 20. Further, the pixel electrode 23 may also have light reflecting properties. In this case, the reflection layer 21 may be omitted. Further, although the common electrode 25 is common in the plurality of organic EL elements 20, an individual cathode may be provided for each of the organic EL elements 20.

5-2. Second Modified Example

Figure 21:
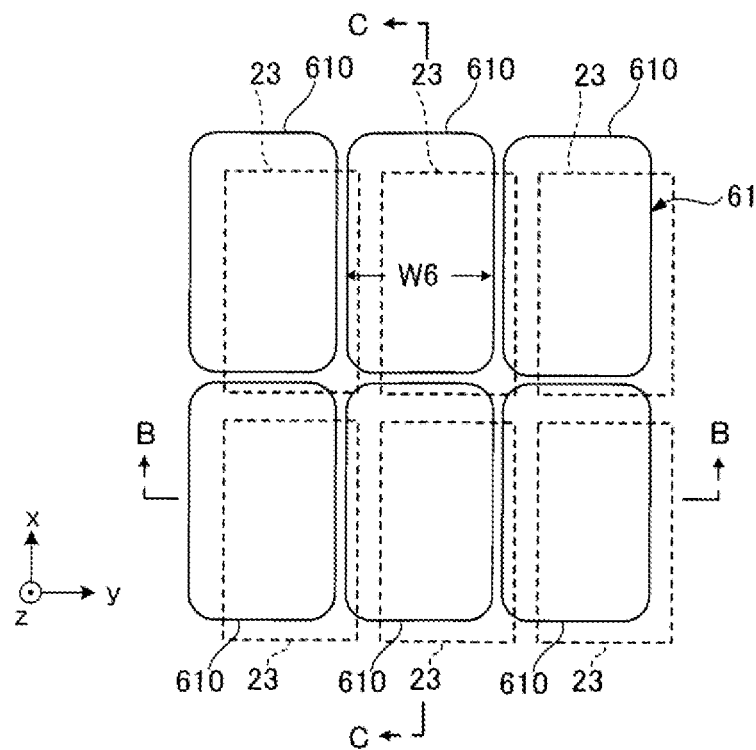
FIG. 21 is a plan view illustrating a modified example of the pixel electrode and the lens.
Figure 22:
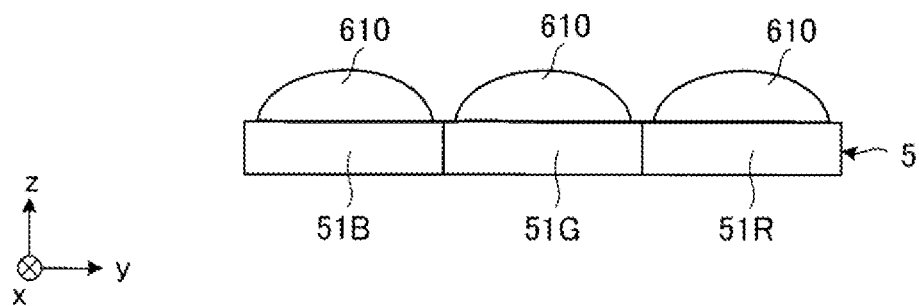
FIG. 22 is a cross-sectional view illustrating a modified example of the colored portion and the lens.
Figure 23:
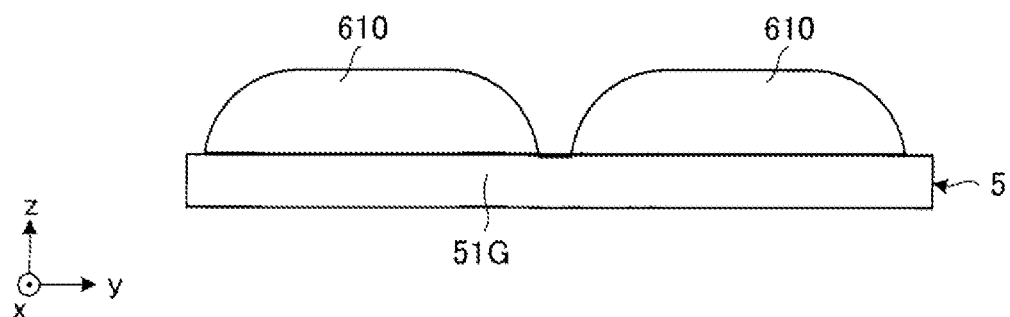
FIG. 23 is a cross-sectional view illustrating a modified example of the colored portion and the lens.

A shape of the pixel electrode 23, the lens 610, and the color filter 5 in each plan view is not limited to the shape in each of the exemplary embodiments described above. FIG. 21 is a diagram illustrating a modified example of the pixel electrode 23 and the lens 610. The shape of the pixel electrodes 23 and the lens 610 illustrated in FIG. 21 in each plan view may be rectangular. A length along the +x direction and a length along the +y direction may be different from each other. FIG. 22 is a diagram illustrating a modified example of the colored portion 51 and the lens 610, and corresponds to a cross section taken along a B-B line illustrated in FIG. 21. FIG. 23 is a diagram illustrating a modified example of the colored portion 51 and the lens 610, and corresponds to a cross section taken along a C-C line illustrated in FIG. 21. As illustrated in FIGS. 22 and 23, a shape of the lens 610 in plan view is appropriately set according to a shape of the light-emitting portion in plan view. Thus, the shape of the lens 610 may correspond to the shape of the pixel electrode 23 illustrated in FIG. 21 in plan view. Note that the same also applies to the shape of the colored portion 51. Further, as illustrated in FIGS. 22 and 23, the lenses 610 adjacent to each other may be separated.

Figure 24:
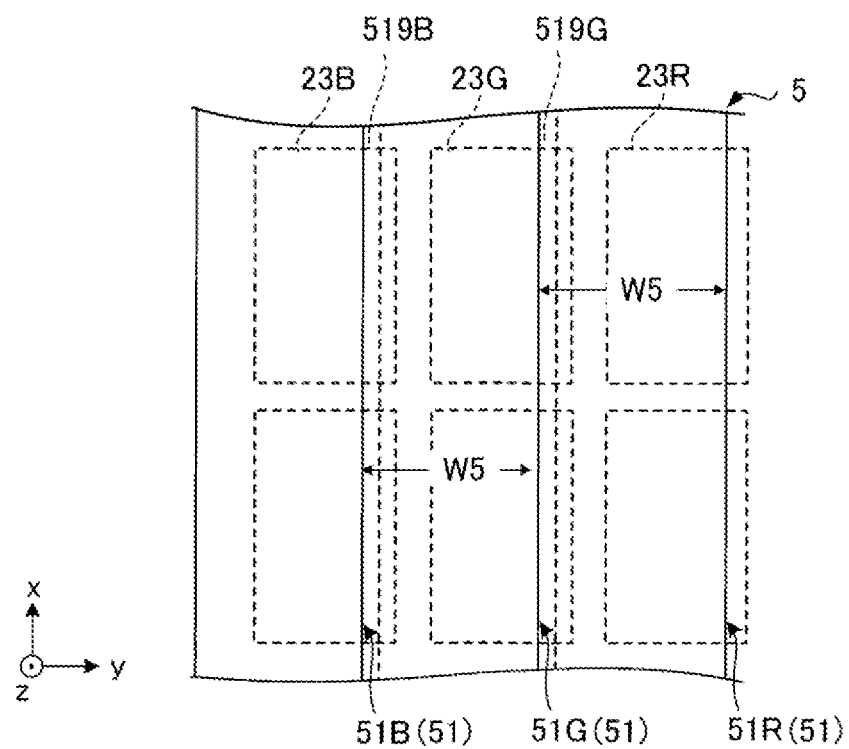
FIG. 24 is a plan view illustrating a modified example of the color filter.

FIG. 24 is a plan view illustrating a modified example of the color filter 5. As illustrated in FIG. 24, the colored portion 51 may be disposed so as to correspond to the plurality of pixel electrodes 23. Specifically, the colored portion 51B overlaps the plurality of pixel electrodes 23B corresponding to blue. The colored portion 51G overlaps the plurality of pixel electrodes 23G corresponding to green. The colored portion 51R overlaps the plurality of pixel electrodes 23R corresponding to red. In the example illustrated in FIG. 24, the colored portions 51B, 51G, and 51R are arranged in a stripe shape. Further, the colored portions 51B, 51G, and 51R may overlap each other in plan view. In FIG. 24, the colored portion 51B includes an overlapping portion 519B that overlaps the colored portion 51G in plan view. The colored portion 51G includes an overlapping portion 519G that overlaps the colored portion 51R in plan view.

Figure 25:
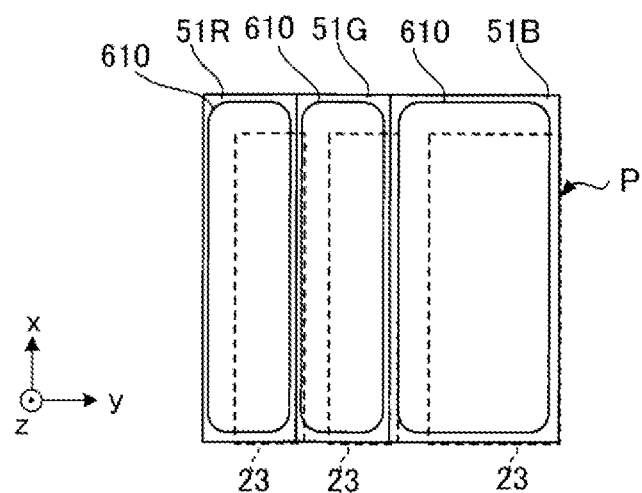
FIG. 25 is a plan view illustrating a modified example of the pixel electrode, the lens, and the colored portion.
Figure 26:
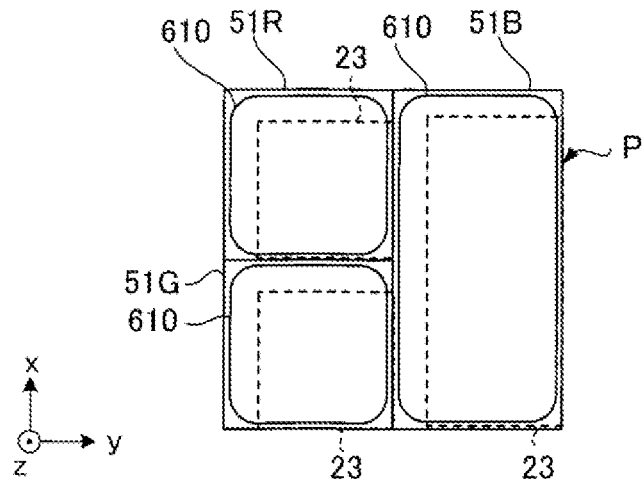
FIG. 26 is a plan view illustrating a modified example of the pixel electrode, the lens, and the colored portion.
Figure 27:
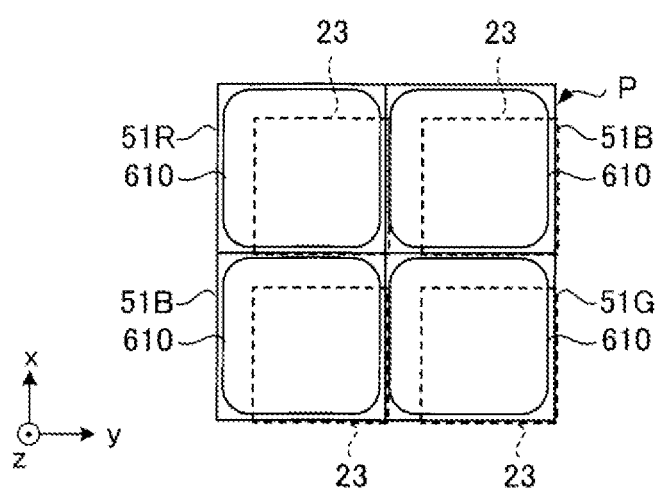
FIG. 27 is a plan view illustrating a modified example of the pixel electrode, the lens, and the colored portion.
Figure 28:
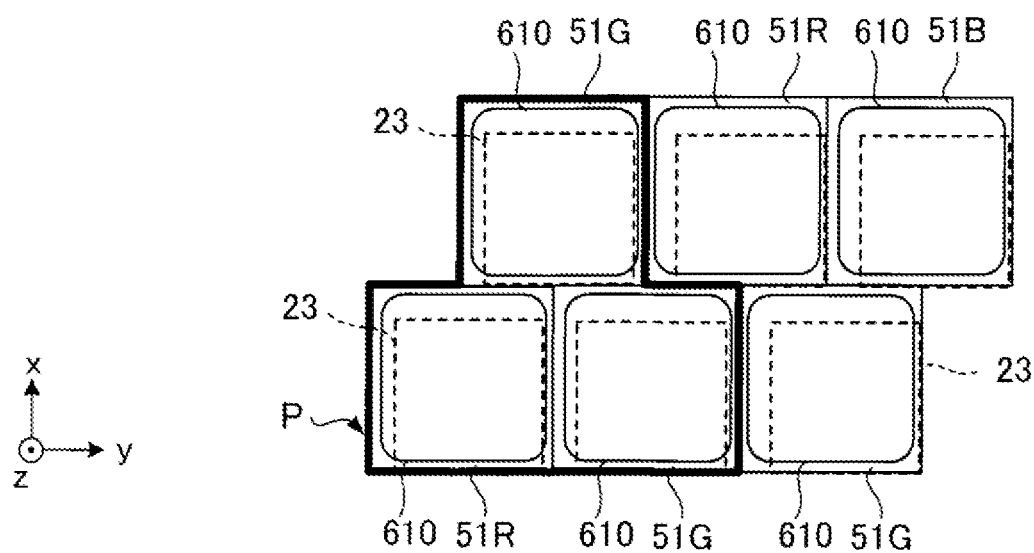
FIG. 28 is a plan view illustrating a modified example of the pixel electrode, the lens, and the colored portion.

FIGS. 25, 26, 27, and 28 are each a plan view illustrating a modified example of the pixel electrode 23, the lens 610, and the colored portion 51. In FIGS. 25, 26, and 27, the pixel electrode 23, the lens 610, and the colored portion 51 in one pixel P are illustrated. In FIG. 28, a portion surrounded by a thick line corresponds to one pixel P.

As illustrated in FIG. 25, shapes of the plurality of pixel electrodes 23 in plan view may be different from each other. The shape of the lens 610 and the colored portion 51 in each plan view may correspond to the shape of the light-emitting portion. Thus, the shape of the lens 610 and the colored portion 51 in each plan view may correspond to the shape of the pixel electrode 23 in plan view. For this reason, as illustrated in FIG. 25, the shapes of the plurality of lenses 610 in plan view may be different from each other. The shapes of the plurality of colored portions 51 in plan view may be different from each other.

As illustrated in FIG. 26, the arrangement of the colored portions 51B, 51G, and 51R may be a so-called rectangle arrangement. The colored portions 51B, 51G, and 51R may not be aligned in the +y direction. As illustrated in FIG. 26, each arrangement of the pixel electrode 23 and the lens 610 is disposed so as to correspond to the arrangement of the colored portion 51.

As illustrated in FIG. 27, the arrangement of the colored portions 51B, 51G, and 51R may be a so-called Bayer arrangement. One pixel P may include the plurality of colored portions 51 of the same color. In FIG. 27, one pixel P includes two colored portions 51B.

As illustrated in FIG. 28, the arrangement of the colored portions 51B, 51G, and 51R may be a so-called delta arrangement. The shape of one pixel P in plan view may not be quadrangular. Note that the shape of the pixel electrode 23, the lens 610, and the colored portion 51 in each plan view may be a polygon other than a square, such as a hexagon, or may be circular, for example, which is not limited to a quadrangular.

5-3. Third Modified Example

The reference colored portion 51z and the first pixel electrode 23x may be disposed offset in plan view with respect to the reference pixel electrode 23z.

6. Electronic Apparatus

The display device 100 in the exemplary embodiments described above is applicable to various electronic apparatuses.

6A. Virtual Image Display Device 900

Figure 29:
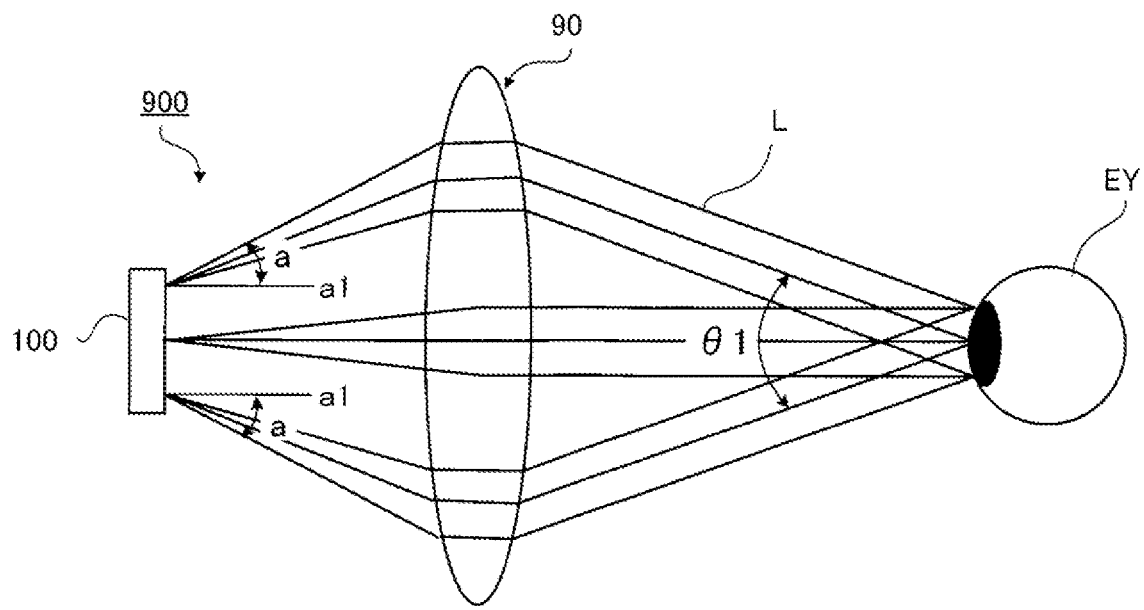
FIG. 29 is a diagram schematically illustrating a part of an internal structure of a virtual image display device.

FIG. 29 is a diagram schematically illustrating a part of an internal structure of the virtual image display device 900 as an example of an electronic apparatus in the present disclosure. The virtual image display device 900 illustrated in FIG. 29 is a head-mounted display (HMD) mounted on a head of a human and configured to display an image. The virtual image display device 900 includes the above-described display device 100 and the eyepiece 90. An image displayed on the display device 100 is emitted as image light L. In FIG. 29, light entering an eye EY is illustrated as the image light L.

The image light L emitted from the display device 100 is magnified by the eyepiece 90 being a condensing lens. Then, the image light L magnified by the eyepiece 90 is guided to the eye EY of a human, and thus the human can see a virtual image formed by the image light L. Note that other various lenses, a light guide plate, and the like may be provided between the eyepiece 90 and the eye EY.

In the virtual image display device 900, the angle of view θ1 needs to be increased in order to acquire a large virtual image. The eyepiece 90 needs to be increased in size in order to increase the angle of view θ1. An angle a expanding outward with respect to a normal line a1 of a surface of the pixel electrode 23 needs to be increased in order to increase the angle of view θ1 by using the display device 100 having a planar area smaller than a planar area of the eyepiece 90.

The virtual image display device 900 includes the above-described display device 100. The display device 100 can increase the radiation angle θ for each sub-pixel P0. Thus, the angle a can be increased further than that in a known device. Accordingly, even when the display device 100 having a planar area smaller than a planar area of the eyepiece 90 is used, the angle of view θ1 can be increased. Thus, even when the display device 100 smaller than the known device is used, a human can observe a virtual image of the same size as that when the known device is used. In other words, a larger virtual image can be formed by using the display device 100 smaller than the known device. The size of the virtual image display device 900 can be reduced by using such a display device 100.

Further, the radiation angle θ in each of the sub-pixels P0 is increased, and thus a range of light that is emitted from each of the sub-pixels P0 and reaches the eye EY is widened. For this reason, a range on which the luminous flux LL emitted from each of the sub-pixels P0 described above is superimposed is widened. Thus, an allowable range of a position of the eye EY in which a virtual image can be seen is widened. Accordingly, individual differences such as a person with a narrow spacing between both eyes, a person with a wide spacing, a person with a large eye EY, and a person with a small eye EY, for example, are suitably compatible.

Note that examples of the "electronic apparatus" including the display device 100 include an apparatus including an eyepiece, such as an electronic viewfinder and electronic binoculars, in addition to the virtual image display device 900 illustrated in FIG. 29. Further, examples of the "electronic apparatus" include an apparatus including the display device 100 as a display unit, such as a personal computer, a smartphone, and a digital camera.

The present disclosure was described above based on the illustrated exemplary embodiments. However, the present disclosure is not limited thereto. In addition, the configuration of each component of the present disclosure may be replaced with any configuration that exerts the equivalent functions of the above-described exemplary embodiments, and to which any configuration may be added. Further, any configuration may be combined with each other in the above-described exemplary embodiments of the present disclosure.

The "display device" is not limited to an organic EL display device, and may be an EL display device using an inorganic material, a liquid crystal display device including a liquid crystal, and a device including an LED array.

The "display device" is not limited to a device that displays a full color image, but may be a device that displays an image only in a single color. For example, the "display device" may be a device that displays an image expressed in green or a device that displays an image expressed in orange.

A portion of the pixel electrode 23 that is in contact with the functional layer 24 may be regarded as a "pixel electrode".

What is claimed is:

1. A display device, comprising:
a first pixel electrode disposed in a display region;
a second pixel electrode disposed in the display region;
a first lens provided corresponding to the first pixel electrode, the first lens overlapping a part of the first pixel electrode in a plan view; and
a second lens provided corresponding to the second pixel electrode, the second lens overlapping a part of the second pixel electrode in the plan view, wherein
in the plan view, a first area where the first pixel electrode and the first lens overlap is larger than a second area where the second pixel electrode and the second lens overlap, and
the first pixel electrode is disposed closer to a center of the display region than the second pixel electrode in the plan view.

2. The display device according to claim 1, wherein
the first area is disposed closer to a center of the display region than the second area in the plan view.

3. The display device according to claim 1, comprising
a first colored portion provided corresponding to the first pixel electrode, the first colored portion overlapping a part of the first pixel electrode in the plan view; and
a second colored portion provided corresponding to the second pixel electrode, the second colored portion overlapping a part of the second pixel electrode in the plan view, wherein
in the plan view, a third area where the first pixel electrode and the first colored portion overlap is larger than a fourth area where the second pixel electrode and the second colored portion overlap.

4. The display device according to claim 3, wherein
the third area is disposed closer to a center of the display region than the fourth area in the plan view.

5. The display device according to claim 1, further comprising:
a common electrode disposed between the first pixel electrode and the first lens layer; and
a light-emitting layer that is disposed between the first pixel electrode and the common electrode, and contains an organic light-emitting material.

6. The display device according to claim 1, further comprising
a first colored portion overlapping a part of the first pixel electrode in the plan view; and
a second colored portion overlapping a part of the second pixel electrode in the plan view, wherein
a distance between a center of the first pixel electrode and a center of the first colored portion is shorter than a distance between a center of the second pixel electrode and a center of the second colored portion in the plan view.

7. An electronic apparatus, comprising the display device according to claim 1.

8. A display device, comprising:
a first pixel electrode disposed in a display region;
a second pixel electrode disposed in the display region;
a first lens overlapping a part of the first pixel electrode in a plan view; and
a second lens overlapping a part of the second pixel electrode in the plan view, wherein
in the plan view, a first area where the first pixel electrode and the first lens overlap is larger than a second area where the second pixel electrode and the second lens overlap, and
in the plan view, the first area is disposed closer to a center of the display region than the second area.

9. An electronic apparatus, comprising the display device according to claim 8.

10. A display device, comprising:
a first pixel electrode disposed in a display region;
a second pixel electrode disposed in the display region;
a first lens overlapping a part of the first pixel electrode in a plan view;
a second lens overlapping a part of the second pixel electrode in the plan view;
a first colored portion overlapping a part of the first pixel electrode in the plan view; and
a second colored portion overlapping a part of the second pixel electrode in the plan view, wherein
in the plan view, a first area where the first pixel electrode and the first lens overlap is larger than a second area where the second pixel electrode and the second lens overlap,
in the plan view, a third area where the first pixel electrode and the first colored portion overlap is larger than a fourth area where the second pixel electrode and the second colored portion overlap, in the plan view, the third area is disposed closer to a center of the display region than the fourth area.

11. An electronic apparatus, comprising the display device according to claim 10.

12. A display device, comprising:
a first pixel electrode;
a second pixel electrode;
a first lens overlapping a part of the first pixel electrode in a plan view;
a second lens overlapping a part of the second pixel electrode in the plan view;
a first colored portion overlapping a part of the first pixel electrode; and
a second colored portion overlapping a part of the second pixel electrode, wherein
in the plan view, a first area where the first pixel electrode and the first lens overlap is larger than a second area where the second pixel electrode and the second lens overlap, and
in the plan view, a distance between a center of the first pixel electrode and a center of the first colored portion is shorter than a distance between a center of the second pixel electrode and a center of the second colored portion.

13. An electronic apparatus, comprising the display device according to claim 12.

* * * * *